(12) United States Patent
Park et al.

(10) Patent No.: US 8,021,977 B2
(45) Date of Patent: Sep. 20, 2011

(54) METHODS OF FORMING CONTACT STRUCTURES AND SEMICONDUCTOR DEVICES FABRICATED USING CONTACT STRUCTURES

(75) Inventors: Young-Lim Park, Hwaseong-si (KR); Hyeong-Geun An, Hwaseong-si (KR); Gyu-Hwan Oh, Hwaseong-si (KR); Dong-Ho Ahn, Suwon-si (KR); Jin-Il Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/627,810

(22) Filed: Nov. 30, 2009

(65) Prior Publication Data

US 2010/0144138 A1   Jun. 10, 2010

(30) Foreign Application Priority Data

Dec. 10, 2008   (KR) .................... 10-2008-0125301

(51) Int. Cl.
*H01L 21/4763* (2006.01)
*H01L 21/768* (2006.01)

(52) U.S. Cl. .......... 438/637; 257/E21.585; 257/E21.577

(58) Field of Classification Search ................ 438/102, 438/637, 700; 257/E21.585, E21.577
See application file for complete search history.

(56) References Cited

U.S. PATENT DOCUMENTS

| 6,589,714 | B2 | 7/2003 | Maimon et al. | |
|---|---|---|---|---|
| 7,220,983 | B2 | 5/2007 | Lung | |
| 2006/0011902 | A1* | 1/2006 | Song et al. | 257/4 |
| 2008/0029755 | A1 | 2/2008 | Lee et al. | |
| 2008/0099753 | A1* | 5/2008 | Song et al. | 257/2 |
| 2008/0142776 | A1* | 6/2008 | Seidl | 257/4 |
| 2010/0117046 | A1* | 5/2010 | Chang et al. | 257/3 |

* cited by examiner

*Primary Examiner* — Matthew Smith
*Assistant Examiner* — Christine Enad
(74) *Attorney, Agent, or Firm* — Myers Bigel Sibley & Sajovec, P.A.

(57) ABSTRACT

Provided are methods of forming contact structures and semiconductor devices fabricated using the contact structures. The formation of a contact structure can include forming a first molding pattern on a substrate, forming an insulating layer to cover at least a sidewall of the first molding pattern, forming a second molding pattern to cover a sidewall of the insulating layer and spaced apart from the first molding pattern, removing a portion of the insulating layer between the first and second molding patterns to form a hole, and forming an insulating pattern between the first and second molding patterns, and forming a contact pattern in the hole.

20 Claims, 19 Drawing Sheets

METHODS OF FORMING CONTACT STRUCTURES AND SEMICONDUCTOR DEVICES FABRICATED USING CONTACT STRUCTURES

CROSS-REFERENCE TO RELATED APPLICATION

This application claims priority under 35 U.S.C. §119 to Korean Patent Application No. 10-2008-0125301, filed on Dec. 10, 2008, the contents of which are herein incorporated by reference in their entirety.

BACKGROUND

1. Field

The field relates generally to semiconductor devices and semiconductor device fabrication and, more particularly, to memory devices and methods of memory device fabrication.

2. Description of Related Art

In recent years, low-power small-sized semiconductor devices have been utilized. Thus, research has been conducted on methods for downscaling elements of the semiconductor devices.

Methods of forming contact structures in semiconductor devices have involved forming insulating layers and contact holes on the conductive region of a semiconductor substrate. These integrated circuit memory devices, which are formed on a semiconductor substrate, store data in a plurality of memory cells. The memory cells are arranged in rows and columns with corresponding word lines and bit lines, respectively. Collectively, the conductive word lines and bit lines are address lines that allow data storage and retrieval for the memory cells. Data storage elements, such as capacitors, and switching devices, such as diodes and transistors, are electrically coupled together to form a memory cell. Thus, contact areas having a variety of geometric shapes and silicon and non-silicon materials have been used to couple the data storage elements and the switching devices. Large contact areas, however, limit efforts to reduce semiconductor device size and power consumption.

SUMMARY

Various embodiments provide methods of forming contact structures that can minimize an interfacial area between structures contacting each other. Various embodiments also provide methods of fabricating semiconductor devices using such contact structures and semiconductor devices using the contact structures.

According to some embodiments, methods of forming contact structures include forming a first molding pattern on a substrate. An insulating layer is formed to cover at least a sidewall of the first molding pattern. A second molding pattern is formed to cover a sidewall of the insulating layer and spaced apart from the first molding pattern. An insulating pattern and hole are formed by removing a portion of the insulating layer between the first and second molding patterns. A contact pattern is formed in the hole.

The hole is defined by sidewalls of the first and second molding patterns and a sidewall of the insulating pattern.

According to other embodiments, methods of fabricating semiconductor devices include forming a first molding pattern having a first opening on a semiconductor substrate. An insulating layer is formed to cover at least a sidewall of the first opening. A second molding pattern is formed to fill a remaining portion of the first opening having the sidewall covered by the insulating layer. A portion of the insulating layer is removed to form a second opening defined by sidewalls of the first and second molding patterns. A contact pattern is formed in the second opening.

Before forming the first molding pattern, the methods may further include forming a switching device on the semiconductor substrate. Thereafter, a conductive plug is formed to be electrically connected to the switching device. The conductive plug may have a sidewall surrounded by an insulating material. The conductive plug may be electrically connected to the contact pattern.

The formation of the switching device and the conductive plug may include forming a first impurity region in the semiconductor substrate. An interlayer insulating layer may be formed on the semiconductor substrate having the first impurity region. The interlayer insulating layer may be patterned to form a hole exposing the first impurity region. A semiconductor pattern may be formed in the hole. The semiconductor pattern may have a second impurity region having a different conductivity type from the first impurity region. A conductive plug may be formed on the semiconductor pattern and in the hole.

The conductive plug may be formed to partially fill the hole. The remaining portion of the hole in which the conductive plug is formed may be defined as the first opening, and the interlayer insulating layer having the first opening may be defined as the first molding pattern. The first opening may partially expose the conductive plug, and may have a line shape or a hole shape when viewed from a plan view.

The contact pattern may include a conductive material layer. Furthermore, the methods may further include forming a data storage element on the contact pattern. Before forming the data storage element, the methods may further include partially etching the contact pattern to partially fill the second opening. Here, the data storage element may fill the second opening together with the partially etched contact pattern. Before forming the data storage element, the methods may further include forming an upper molding pattern having a third opening partially exposing the contact pattern. At least a portion of a sidewall of the data storage element may be surrounded by the upper molding pattern.

The contact pattern may include at least one of a conductive material layer and a data storage material layer.

The patterning of the insulating layer may include forming a mask to partially expose the insulating layer. The partially exposed insulating layer may be selectively etched.

According to still other embodiments, a semiconductor device includes a semiconductor substrate and spaced-apart first and second molding patterns disposed on the semiconductor substrate. An insulating pattern is bounded by the first and second molding patterns. A contact pattern is bounded by sidewalls of the first and second molding patterns.

The device may further include a data storage element disposed on the contact pattern.

The device may further include an upper molding pattern having an opening partially exposing a top surface of the contact pattern.

The contact pattern may include at least one of a conductive material layer and a data storage material layer.

BRIEF DESCRIPTION OF THE DRAWINGS

Various embodiments are described in further detail below with reference to the accompanying drawings. It should be understood that various aspects of the drawings may have been exaggerated for clarity.

DETAILED DESCRIPTION OF THE EMBODIMENTS

Figure 1:
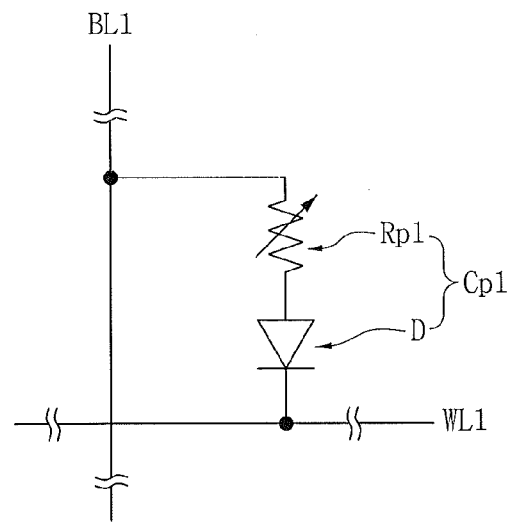
FIG. 1 is an equivalent circuit diagram of a memory cell using a diode as a switching device.

Various embodiments will now be described more fully with reference to the accompanying drawings, in which some embodiments are shown. The present invention may, however, be embodied in many different forms and should not be construed as being limited to the embodiments set forth herein. Rather, these embodiments are provided so that this disclosure is thorough and complete, and will fully convey the scope of the present invention to those skilled in the art. In the drawings, the sizes and relative sizes of layers and regions may be exaggerated for clarity. Like reference numerals in the drawings denote like elements throughout, and thus their descriptions will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a memory cell using a diode as a switching device. The memory device may include a word line WL1 and a bit line BL1 that cross each other in a cell array region. A memory cell Cp1 may be provided at a crossing point between the word line WL1 and the bit line BL1. The memory cell Cp1 may include a data storage element Rp1 and a diode D that are electrically connected to each other. One terminal of the data storage element Rp1 may be electrically connected to a P-type semiconductor region of the diode D, and the other terminal of the data storage element Rp1 may be electrically connected to the bit line BL1. Also, an N-type semiconductor region of the diode D may be electrically connected to the word line WL1.

Figure 2:
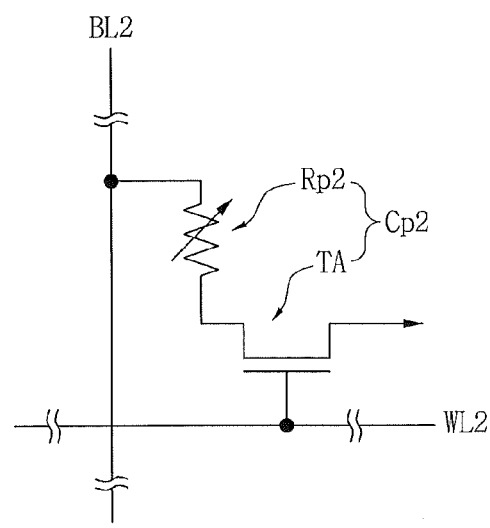
FIG. 2 is an equivalent circuit diagram of a memory cell using a transistor as a switching device.

FIG. 2 is an equivalent circuit diagram of a memory cell using a transistor as a switching device. The memory device may include a word line WL2 and a bit line BL2 that cross each other. A memory cell Cp2 may be provided at a crossing point between the word line WL2 and the bit line BL2. The memory cell Cp2 may include a data storage element Rp2, which is electrically connected to the bit line BL2, and a switching device, which is electrically connected to the data storage element Rp2. The switching device may be an access MOS transistor TA having a gate electrode, a source region, and a drain region. In this case, one terminal of the data storage element Rp2 may be electrically connected to the drain region of the access MOS transistor TA, and the other terminal of the data storage element Rp2 may be electrically connected to the bit line BL2. Also, the gate electrode of the access MOS transistor TA may be electrically connected to the word line WL2.

The data storage elements Rp1 and Rp2 may be formed of a material layer whose resistance varies with current passing through the material layer. For example, the data storage elements Rp1 and Rp2 may be formed of a phase-change material layer whose resistance varies with the phase of the phase-change material layer.

Hereinafter, methods of forming a contact electrically connecting the data storage elements Rp1 and Rp2 with the switching devices D and TA and methods of fabricating a semiconductor device using the contact will be described.

To begin with, methods of fabricating semiconductor devices according to some embodiments will now be described with reference to FIGS. 3A through 8D. Specifically, FIGS. 3A, 4A, 5A, 6A, 7A and 8A are plan views illustrating methods of fabricating a semiconductor device according to some embodiments, and FIGS. 3B, 4B, 5B, 5C, 6B, 7B, 8B, 8C and 8D are cross-sectional views illustrating the methods of fabricating the semiconductor device according to some embodiments. In FIGS. 3B, 4B, 5B, 6B, 7B and 8B, reference character "A" denotes a region taken along line I-I' of FIGS. 3A, 4A, 5A, 6A, 7A and 8A, and reference character "B" denotes a region taken along line II-II' of FIGS. 3A, 4A, 5A, 6A, 7A and 8A.

Figure 3A:
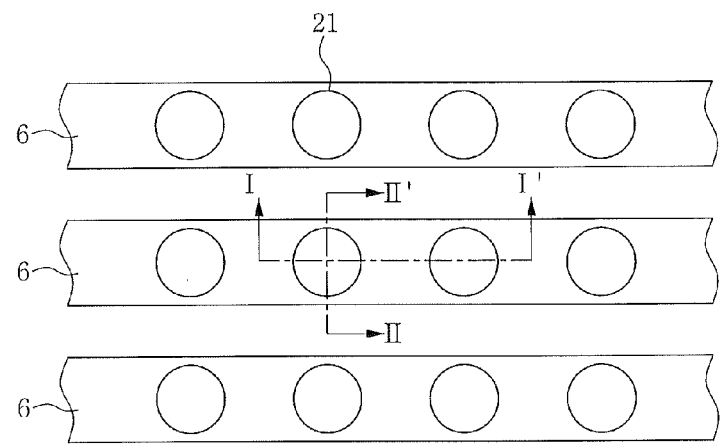
FIGS. 3A through 11B are diagrams of a semiconductor device according to various embodiments.
Figure 3B:
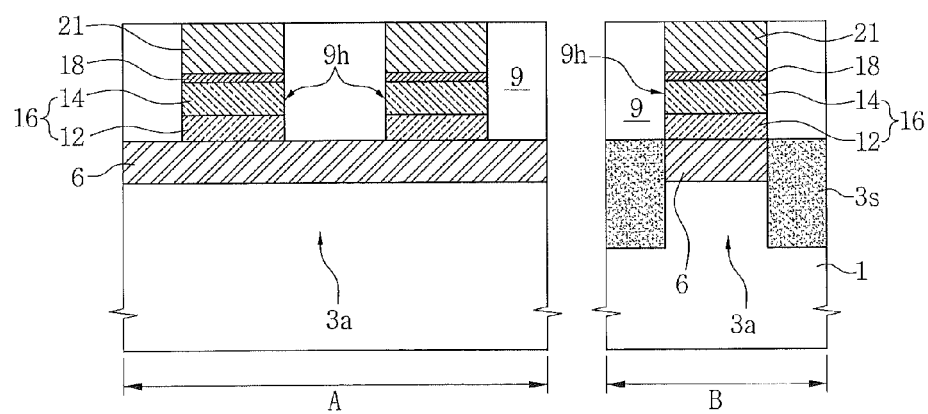

Referring to FIGS. 3A and 3B, a semiconductor substrate 1 of a first conductivity type may be prepared. An isolation region 3s defining a plurality of active regions 3a may be formed in a predetermined region of the semiconductor substrate 1. The isolation region 3s may be formed using a shallow trench isolation (STI) technique. The active regions 3a may be defined to be substantially parallel to one another.

According to various embodiments, the semiconductor substrate 1 may be a silicon-on-insulator (SOI) substrate having a single crystalline semiconductor body layer. In this case, the process of forming the isolation region 3s may be replaced by a process of patterning the single crystalline semiconductor body layer to form single crystalline semiconductor body patterns and filling spaces between the single crystalline semiconductor body patterns with an insulating material layer. Also, the single crystalline semiconductor body patterns may correspond to the active regions 3a.

Impurity ions of a second conductivity type different from the first conductivity type may be implanted into the active regions 3a, thereby forming first impurity regions 6 of the second conductivity type. As a result, the isolation region 3s may serve to electrically isolate the first impurity regions 6 of the second conductivity type from one another. The first conductivity type may be a P type, and the second conductivity type may be an N type. Conversely, the first conductivity type may be an N type, and the second conductivity type may be a P type. Each of the first impurity regions 6 may correspond to the word line WL1 of FIG. 1.

An interlayer insulating layer 9 may be formed on the entire surface of the semiconductor substrate 1 having the first impurity regions 6. The interlayer insulating layer 9 may be a silicon oxide layer. The interlayer insulating layer 9 may be patterned, thereby forming a plurality of holes 9h exposing predetermined regions of the first impurity regions 6. The holes 9h may have a circular shape when viewed from a plan view. However, the holes 9h are not limited to the circular shape. For example, when viewed from a plan view, the holes 9h may have one of other various shapes, such as a rectangular shape or an elliptical shape.

Semiconductor patterns 16 may be formed in the holes 9h. For instance, the semiconductor patterns 16 may be formed using an epitaxial technique. A second impurity region 12 and a third impurity region 14 may be sequentially stacked in the semiconductor patterns 16. For example, impurity ions of a second conductivity type may be implanted into the semiconductor patterns 16 to form the second impurity region 12, while impurity ions of a first conductivity type may be implanted into the semiconductor patterns 16 to form the third impurity region 14. The second impurity region 12 may have a lower dopant concentration than the first impurity region 6. Thus, the second and third impurity regions 12 and 14 may constitute a cell diode.

Meanwhile, the second and third impurity regions 12 and 14 may have the same conductivity type, for example, the first conductivity type. In this case, the first and second impurity regions 6 and 12 may constitute a cell diode.

Cell diode electrodes 18 may be formed on the semiconductor patterns 16. The cell diode electrodes 18 may be in ohmic contact with the third impurity regions 14 of the semiconductor patterns 16. For example, the cell diode electrodes 18 may be formed of a metal silicide layer, such as a cobalt silicide layer, a nickel silicide layer, or a titanium silicide layer.

Conductive buffer layers 21 may be formed on the diode electrodes 18. The conductive buffer layers 21 may be formed of a metallic material, such as tungsten. The conductive buffer layers 21 may be formed in the holes 9h. Here, the conductive buffer layers 21 may be defined as "conductive plugs".

Meanwhile, each of the conductive plugs 21 may include regions having different resistivities. For example, each of the conductive plugs 21 may include a first region having a first resistivity and a second region having a second resistivity higher than the first resistivity. The second region may be disposed on the first region. In other words, upper regions of the conductive plugs 21 may be high-resistance regions, while lower regions of the conductive plugs 21 may be low-resistance regions. The formation of the conductive plugs 21 may include forming a conductive material layer in the holes 9h and forming a conductive nitride layer in an upper region of the conductive material layer. The conductive material layer may be a titanium layer, a tungsten layer, or a tantalum layer. The conductive nitride layer may be formed using a process for increasing the resistance of the surface of the conductive material layer, for example, a nitridation process. Also, the conductive nitride layer may be formed of a material having a higher resistivity than the conductive material layer. Meanwhile, the conductive plugs 21 may be formed of different kinds of material layers. For instance, each of the conductive plugs 21 may include a first conductive layer and a second conductive layer that are sequentially stacked. The second conductive layer may have a higher resistivity than the first conductive layer. For example, each of the conductive plugs 21 may include at least two layers including a Ti layer, a Si layer, a Ta layer, a Mo layer, a W layer, a Ru layer, a Ta layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, and/or a Cu group layer. Here, an upper layer of the at least two layers may have a higher resistivity than a lower layer thereof.

Figure 4A:
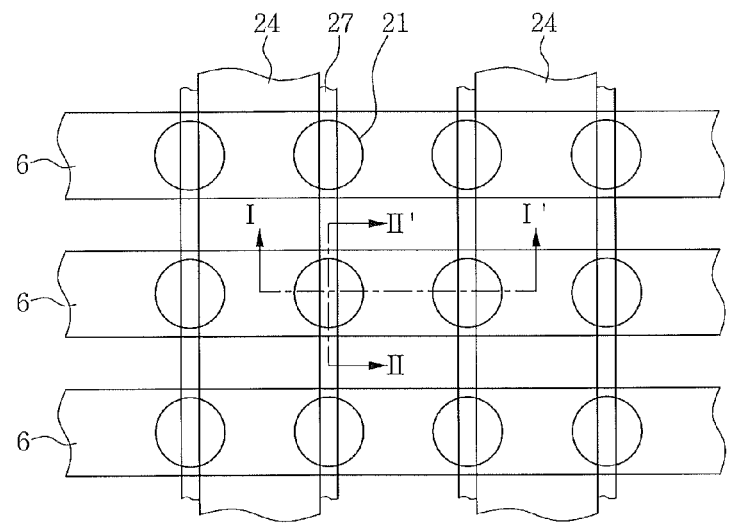
Figure 4B:
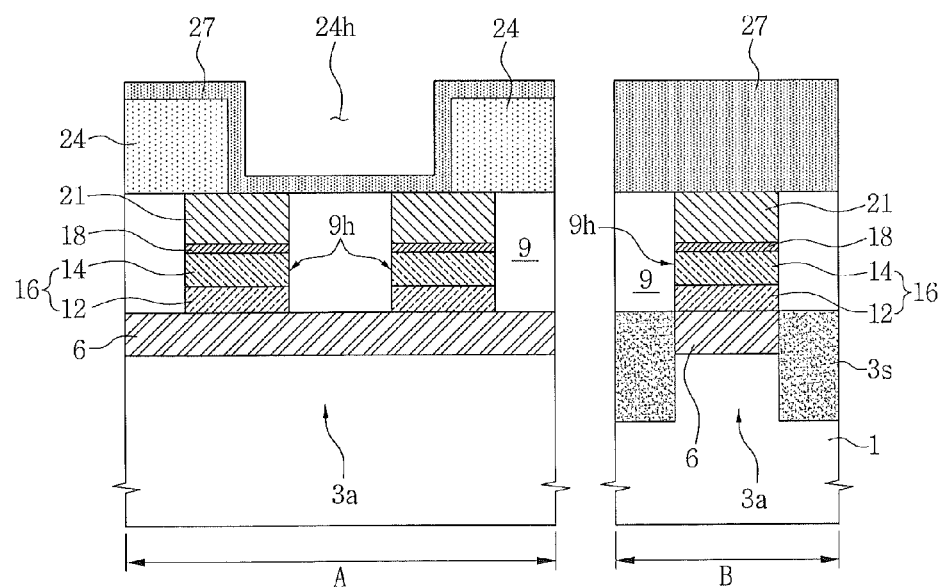

Referring to FIGS. 4A and 4B, first molding patterns 24 having first openings 24h may be formed on the semiconductor substrate 1 having the conductive plugs 21. The first molding patterns 24 may be formed in the shape of lines that cross the impurity regions 6. Also, the first opening 24h may have a line shape when viewed from a plan view.

Each of the first molding patterns 24 may be formed to partially cover adjacent ones of the conductive plugs 21. That is, two adjacent ones of the conductive plugs 21 disposed on one of the first impurity regions 6 may be partially covered by the corresponding one of the first molding patterns 24. The first molding patterns 24 may include a silicon oxide layer, a silicon nitride layer, and/or a silicon oxynitride (SiON) layer.

An insulating layer 27 may be formed to cover at least a sidewall of the first opening 24h. For example, the insulating layer 27 may cover the entire surface of the semiconductor substrate 1 having the first molding patterns 24. The insulating layer 27 may include a silicon oxide layer, a silicon nitride layer, a silicon oxynitride (SiON) layer, and/or an insulating carbon layer.

According to various embodiments, the insulating layer 27 may have a spacer shape. For example, an insulating layer may be formed on the entire surface of the semiconductor substrate 1 having the first molding patterns 24 and etched using an anisotropic etching process, thereby forming a spacer on a sidewall of the first opening 24h.

Figure 5A:
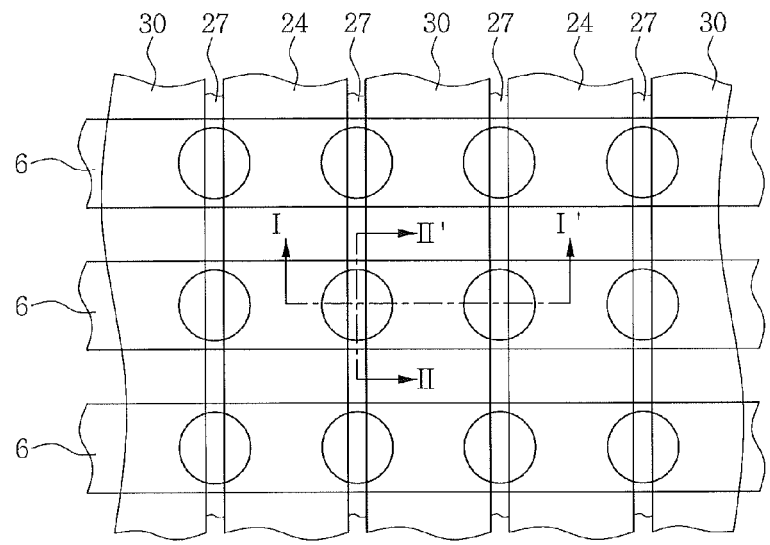
Figure 5B:
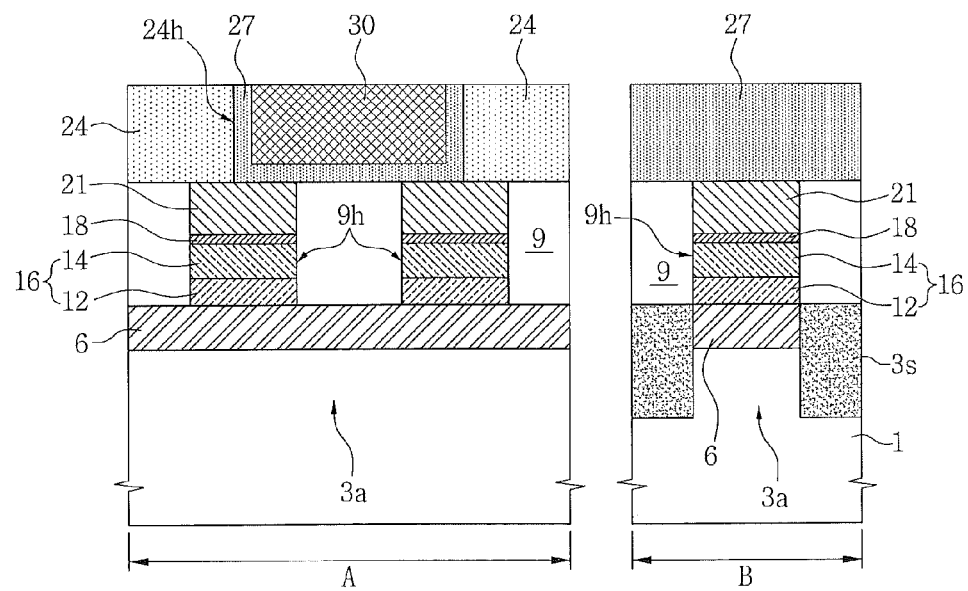

Referring to FIGS. 5A and 5B, a second molding layer may be formed on the insulating layer 27 to fill the remaining portion of the first opening 24h. Thereafter, the second molding layer may be planarized to form second molding patterns 30 defined in the first openings 24h. For example, the second molding layer may be planarized until the first molding patterns 24 are exposed, thereby forming the second molding patterns 30. The second molding layer may be planarized using a chemical mechanical polishing (CMP) process and/or an etchback process. Alternatively, the planarization of the second molding layer may be performed using a plasma etching process.

The second molding patterns 30 may be formed of the same insulating material as the first molding patterns 24. Alternatively, the second molding patterns 30 may be formed of a different insulating material from the first molding patterns 24. For example, when the first molding patterns 24 are formed of a silicon nitride layer, the second molding patterns 30 may be formed of a silicon oxide layer.

The insulating layer 27 may be formed of a material layer having an etch selectivity with respect to the first and second molding patterns 24 and 30. For example, when the first and second molding patterns 24 and 30 are formed of a silicon nitride layer and/or a silicon oxide layer, the insulating layer 27 may be formed of an insulating carbon layer. Alternatively, when the first and second molding patterns 24 and 30 are formed of a silicon oxide layer, the insulating layer 27 may be formed of a silicon nitride layer.

Figure 5C:
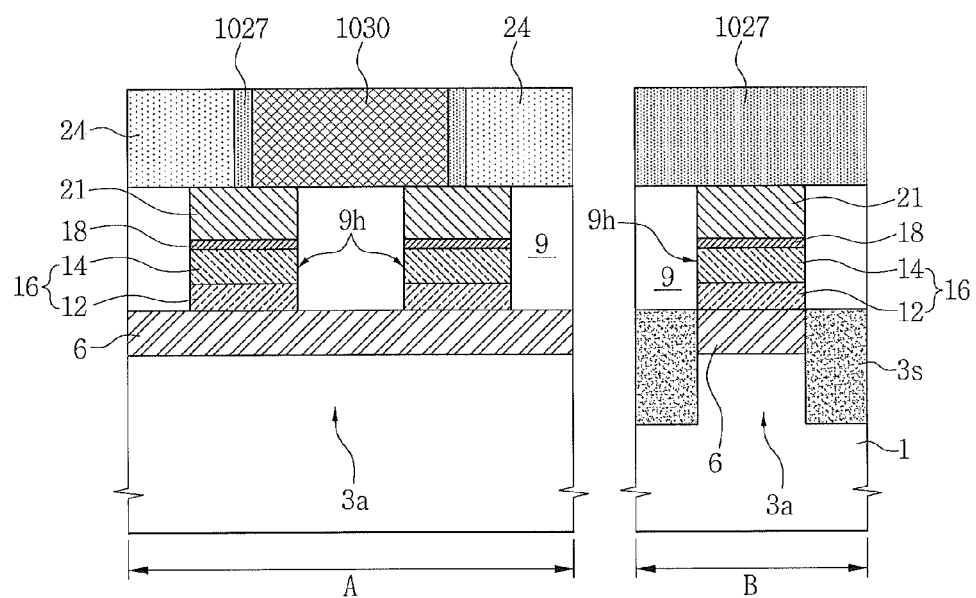

According to various embodiments, the insulating layer 27 of FIG. 4B may be a spacer-type insulating layer 1027 of FIG. 5C. Specifically, the insulating layer 27 of FIG. 4B may be etched using an anisotropic etching process, thereby forming the spacer-type insulating layer 1027 of FIG. 5C. Second molding patterns 1030 may be formed to fill the remaining portions of the first openings 24h having sidewalls covered by the insulating layer 1027.

Figure 6A:
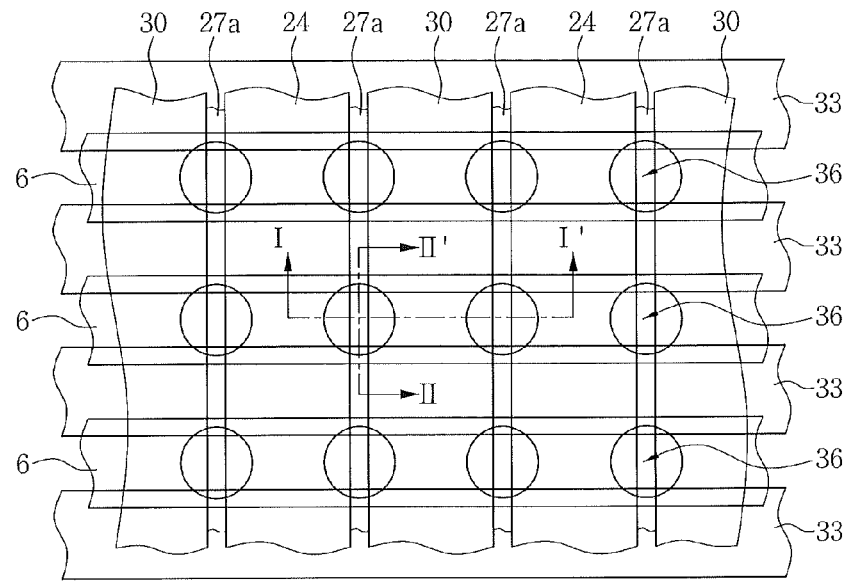
Figure 6B:
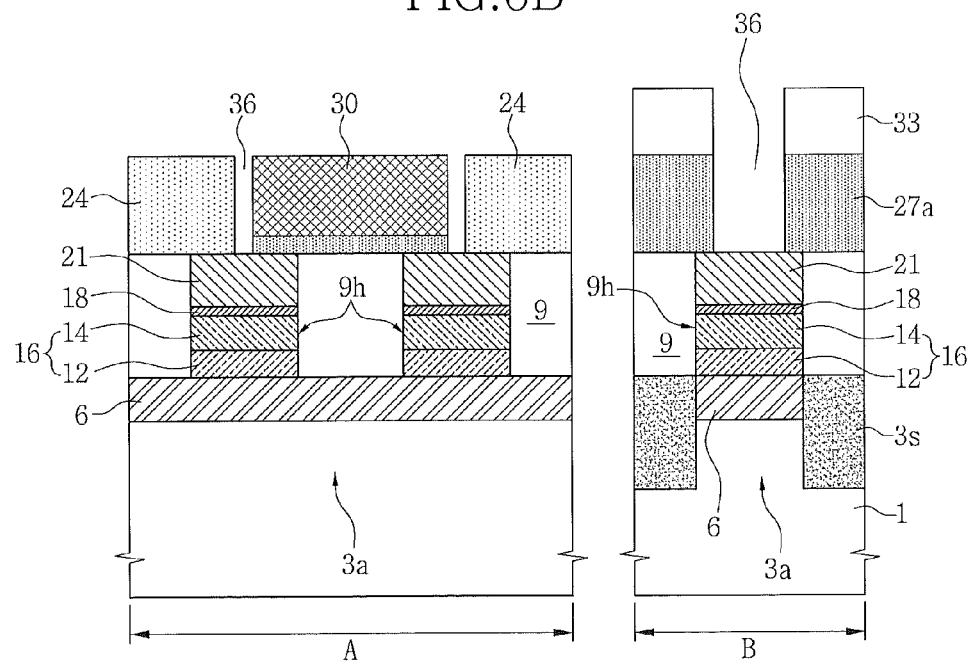

Referring to FIGS. 6A and 6B, a mask 33 may be formed on the semiconductor substrate 1 having the second molding patterns 30 to partially expose the insulating layer 27. The mask 33 may be formed of a photoresist material.

According to various embodiments, the mask 33 may include a hard mask having an etch selectivity with respect to the first and second molding patterns 24 and 30 and the insulating layer 27. For instance, when the first and second molding patterns 24 and 30 are formed of a silicon oxide layer and the insulating layer 27 is formed of an insulating carbon layer, the mask 33 may include a hard mask that is formed by patterning a silicon nitride layer using a photolithography process.

The insulating layer 27 exposed by the mask 33 may be selectively etched using the mask 33 as an etch mask, thereby forming insulating patterns 27a having second openings 36 exposing the conductive plugs 21. For example, when the insulating layer 27 is an insulating carbon layer, the insulating layer 27 may be selectively etched, such as by an $O_2$ plasma etch process.

Meanwhile, the second openings 36 may be holes defined by sidewalls of the first and second molding patterns 24 and 30 and sidewalls of the insulating patterns 27a. Thus, when viewed from a plan view, each of the second openings 36 may have a rectangular shape.

Figure 7A:
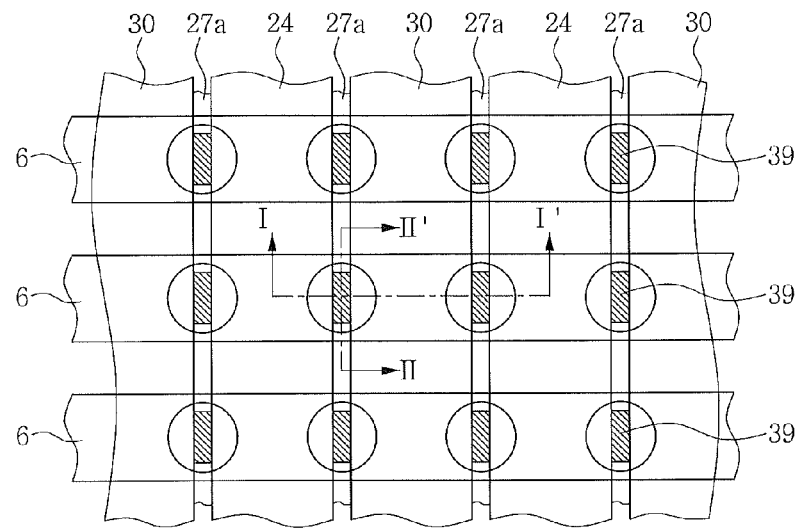
Figure 7B:
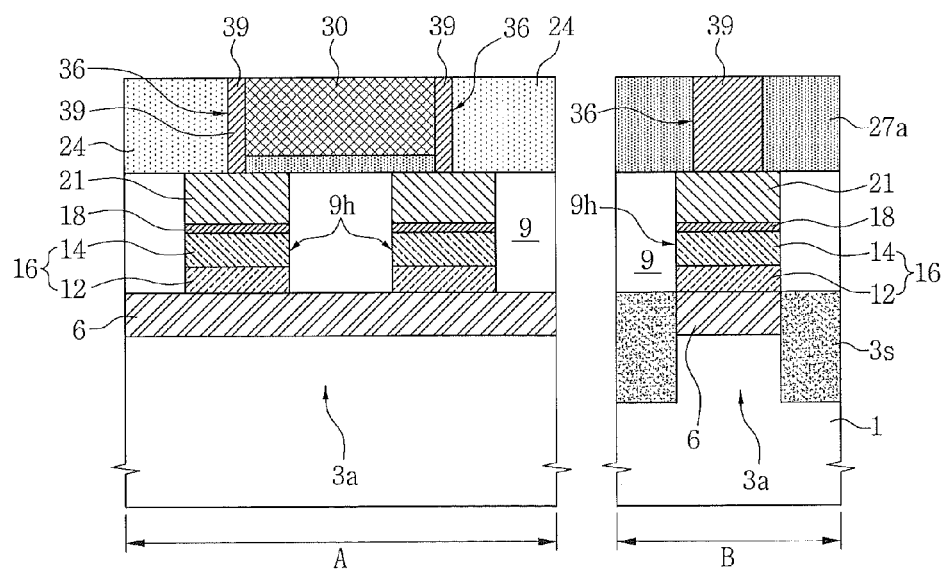

Referring to FIGS. 7A and 7B, the mask (33 in FIGS. 6A and 6B) may be selectively removed. Meanwhile, when the mask 33 includes a hard mask formed of for example, a silicon nitride layer, the removal of the hard mask of the mask 33 may be omitted.

First conductive patterns 39 may be formed in the second openings 36. The first conductive patterns 39 may include a Ti layer, a Si layer, a Ta layer, a Mo layer, a W layer, a Ru layer, a Ta layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and combinations thereof.

The first conductive patterns 39 may be formed to fill the second openings 36. The formation of the first conductive patterns 39 may include forming a conductive layer on the entire surface of the semiconductor substrate 1 having the second openings 36 and planarizing the conductive layer until the first and second molding patterns 24 and 30 are exposed. The planarization of the conductive layer may be performed using a CMP process and/or an etchback process. Thus, the first conductive patterns 39 may be defined by the first and second molding patterns 24 and 30 and the insulating patterns 27a and electrically connected to the conductive plugs 21.

When viewed from a plan view, each of the first conductive patterns 39 may be formed to have a major axis and a minor axis. The major axis of each of the first conductive patterns 39 may cross the first impurity regions 106.

Figure 8A:
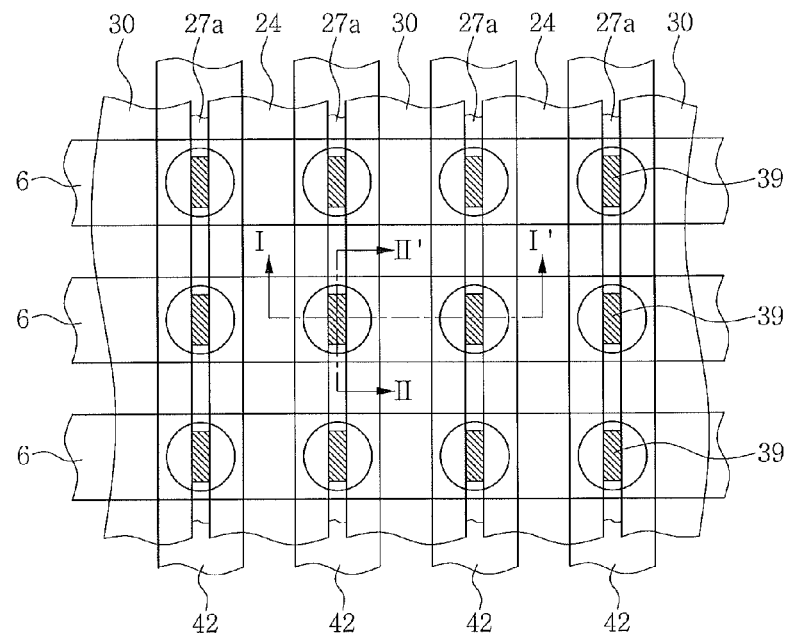
Figure 8B:
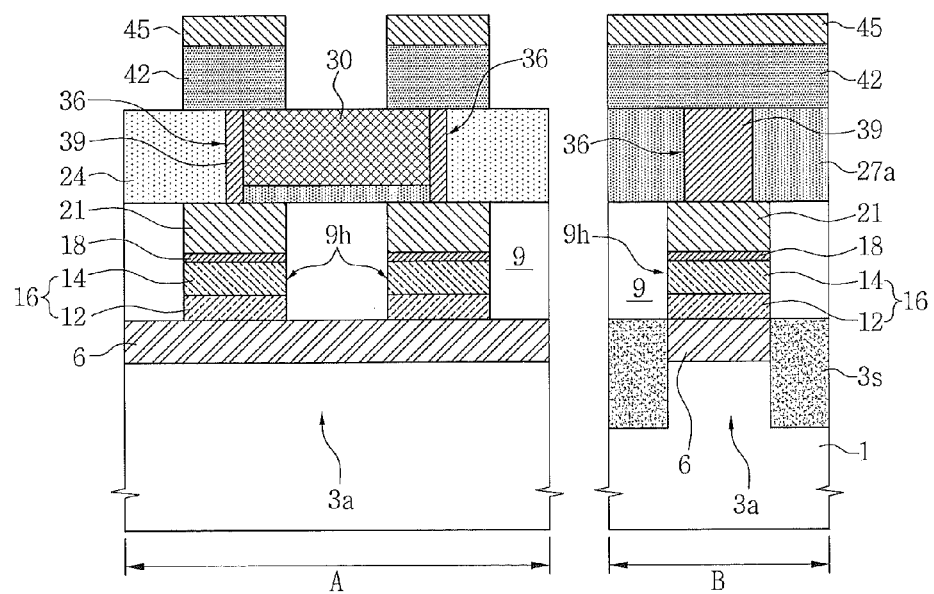

Referring to FIGS. 8A and 8B, data storage elements 42 and second conductive patterns 45 may be sequentially formed on the first conductive patterns 39. The data storage elements 42 may be formed in the shape of lines spaced apart from one another. For example, when viewed from a plan view, the data storage elements 42 may be formed in the shape of lines that cross the first impurity regions 6. Alternatively, the data storage elements 42 may be formed in the shape of islands spaced apart from one another.

The data storage elements 42 may be formed of a material layer whose resistance varies with current passing through the material layer. For example, the data storage elements 42 may be formed of a phase-change material layer whose resistance varies with the phase of the material layer. The phase-change material layer may include Te, Se, Ge, Sb, Bi, Pb, Sn, Ag, As, S, Si, P, O, and/or C. For example, the phase-change material layer may be formed of a chalcogenide layer, such as a GeSbTe (GST) layer, and applied to a phase-change memory cell.

The second conductive patterns 45 may include a Ti layer, a Si layer, a Ta layer, a Mo layer, a W layer, a Ru layer, a Ta layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and combinations thereof.

Each of the data storage elements 42 may correspond to the data storage element Rp1 of FIG. 1. Also, each of the second conductive patterns 45 may be electrically connected to the bit line BL1 of FIG. 1 or directly used as the bit line BL1 of FIG. 1.

The present invention is not limited to the above-described embodiments but is embodied in different forms. Hereinafter, variations of the above-described embodiments will be described.

Figure 8C:
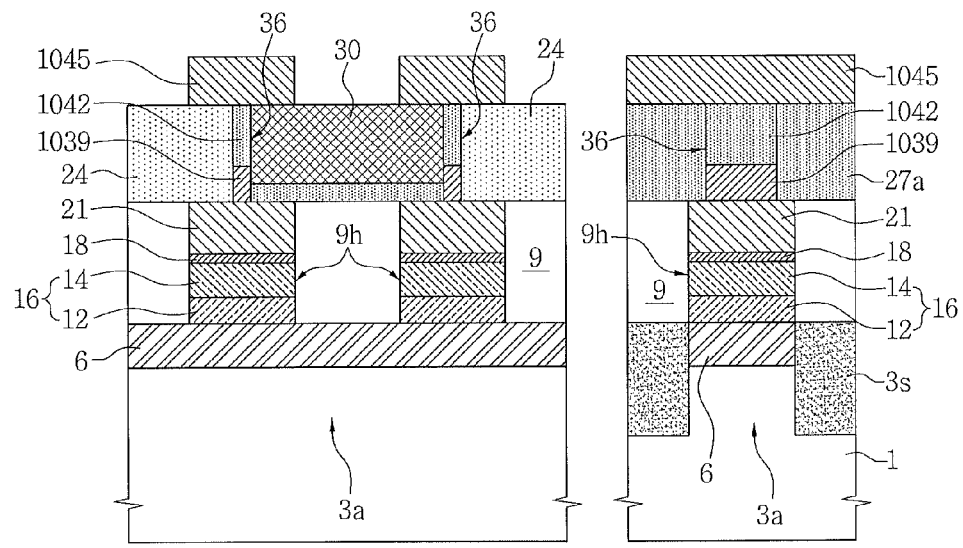

The above-described first conductive patterns 39 and data storage elements 42 shown in FIG. 8B may be embodied in forms of FIG. 8C.

Referring to FIG. 8C, before forming the data storage elements 42 of FIG. 8B, an additional etch process may be performed on the first conductive patterns 39 of FIG. 8B, thereby forming modified first conductive patterns 1039 to partially fill the second openings 36. Thereafter, data storage elements 1042 may be formed to fill the remaining portions of the second openings 36, and second conductive patterns 1045 may be formed on the data storage elements 1042. Thus, according to various embodiments of FIG. 8C, the second openings 36 may be filled with the first conductive patterns 1039 and the data storage elements 1042.

Figure 8D:
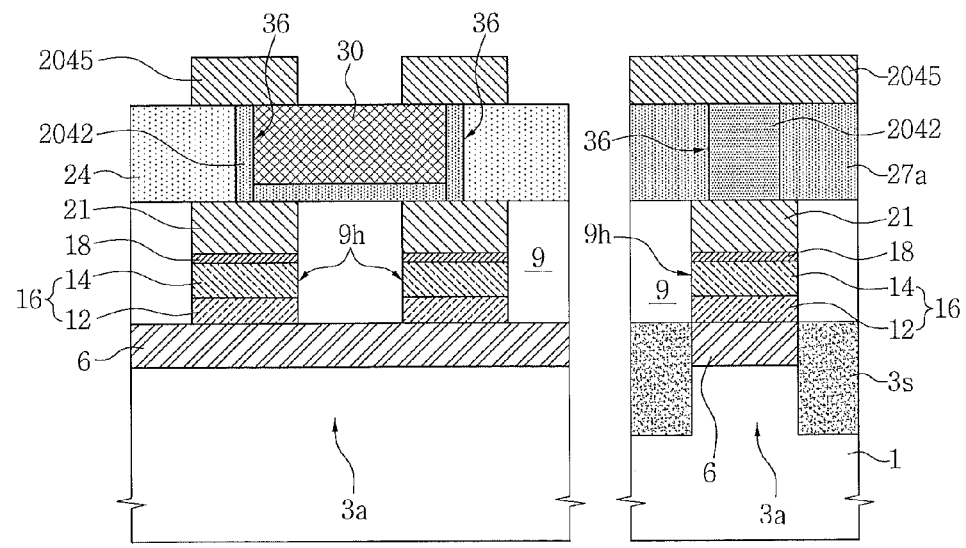

According to various embodiments, the first conductive patterns 39 and the data storage elements 42 of FIG. 8B may be embodied in forms of FIG. 8D.

Referring to FIG. 8D, the process of forming the first conductive patterns 39 as described with reference to FIGS. 7A and 7B may be omitted, and data storage elements 2042 may be formed in the second openings 36. Thus, the data storage elements 2042 may fill the second openings 36 and be electrically connected to the conductive plugs 21. Upper electrodes 2045 may be formed on the data storage elements 2042. Here, the conductive plugs 21 may be defined as lower electrodes.

According to the above-described embodiments, methods of forming contact structures to minimize a contact area between two selected structures are provided. In particular, a pattern provided in the second openings 36 may be defined as a "contact pattern," and an interfacial area between a top surface and/or bottom surface of the contact pattern and another structure may be minimized. For example, contact areas between the above-described data storage elements 42, 1042, and 2042 and the underlying structures 39, 1039, and 21 may be minimized.

Accordingly, when the present embodiments are applied to a phase-change memory device (PRAM), a lower electrode or phase-change material layer of the phase-change memory device may be embodied by the above-described contact pattern. That is, the contact pattern may be used as a phase-change material layer or an electrode that contacts a phase-change material layer to generate Joule heat at an interface between the electrode and the phase-change material layer, thereby reducing the reset current of the PRAM.

The present invention is not limited to the above-described embodiments but is embodied also in the forms shown in FIGS. 9A through 18. Hereinafter, variations of the above-described embodiments will be described.

Figure 9A:
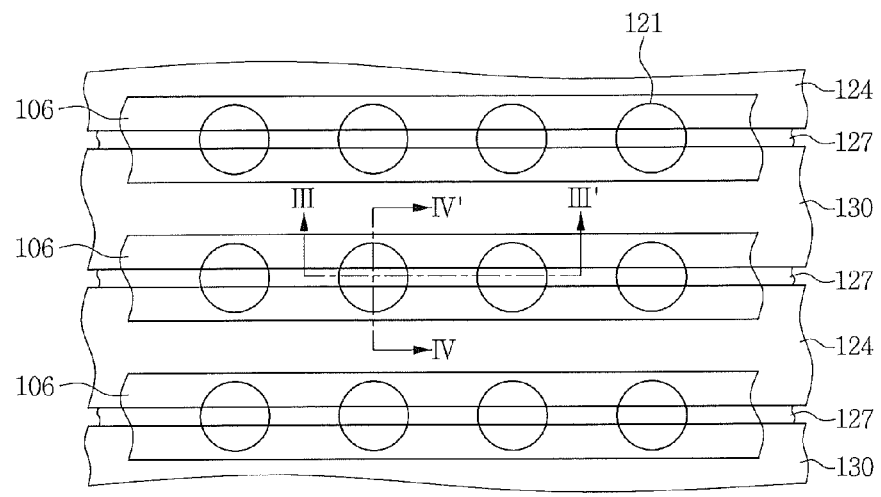
Figure 9B:
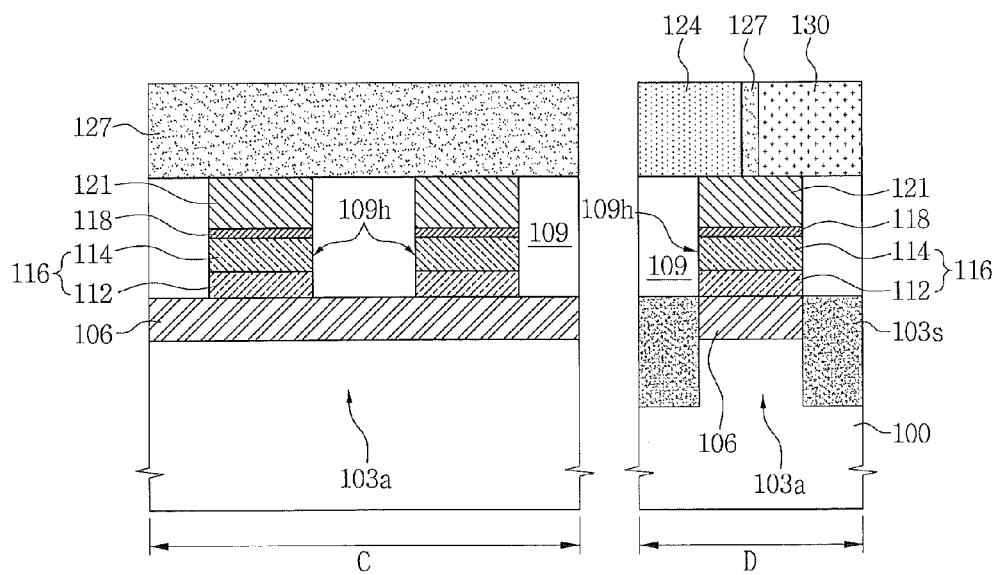
Figure 10A:
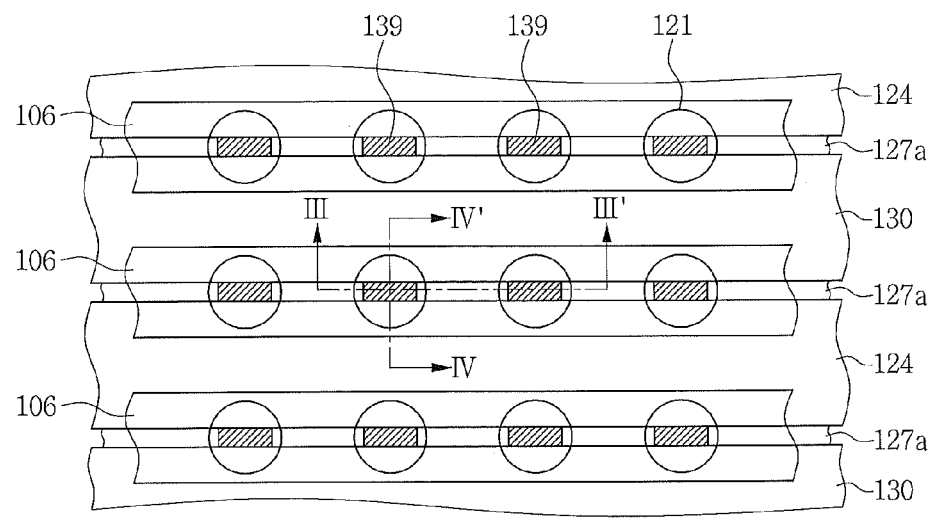
Figure 10B:
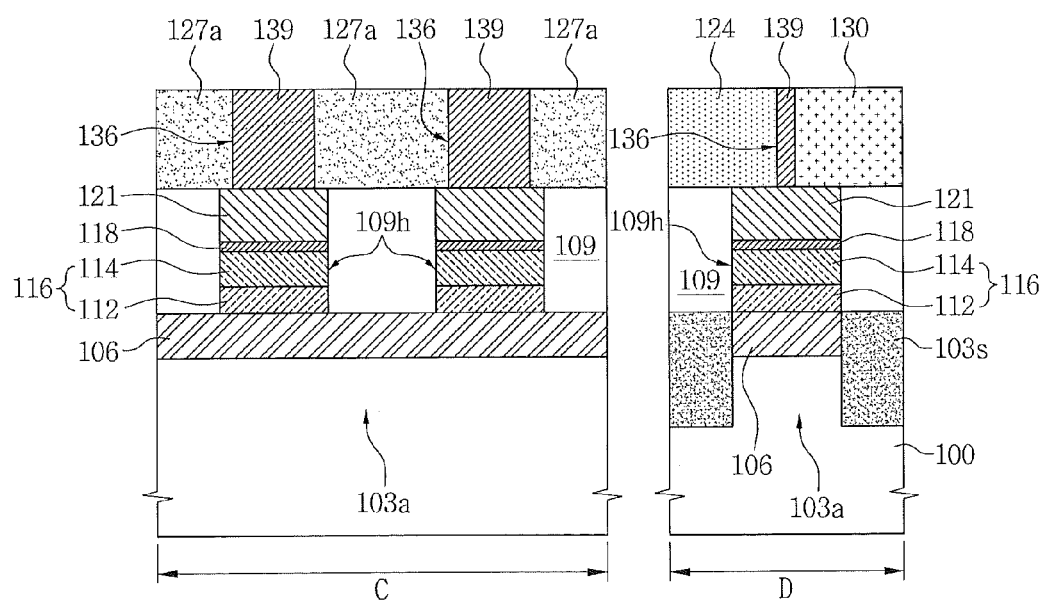
Figure 11A:
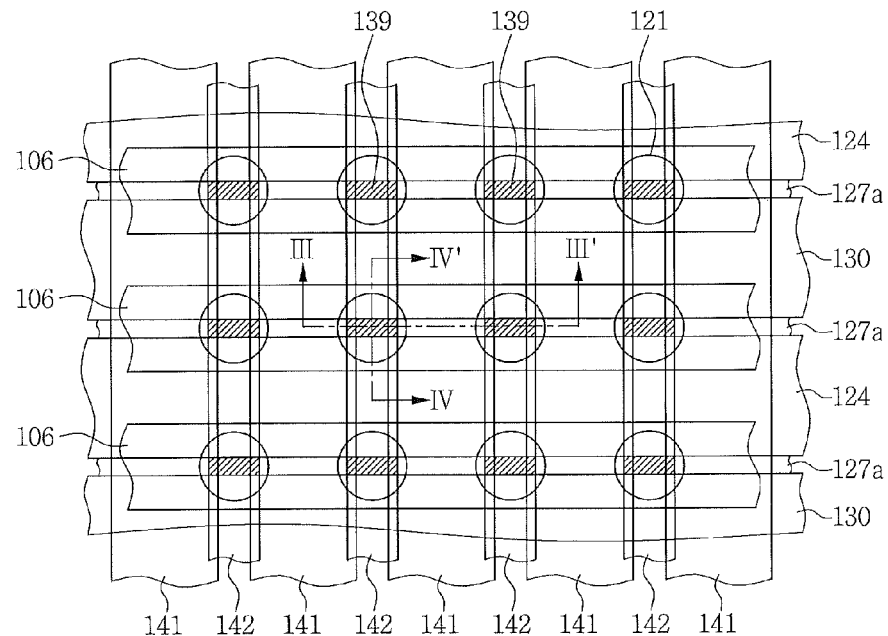
Figure 11B:
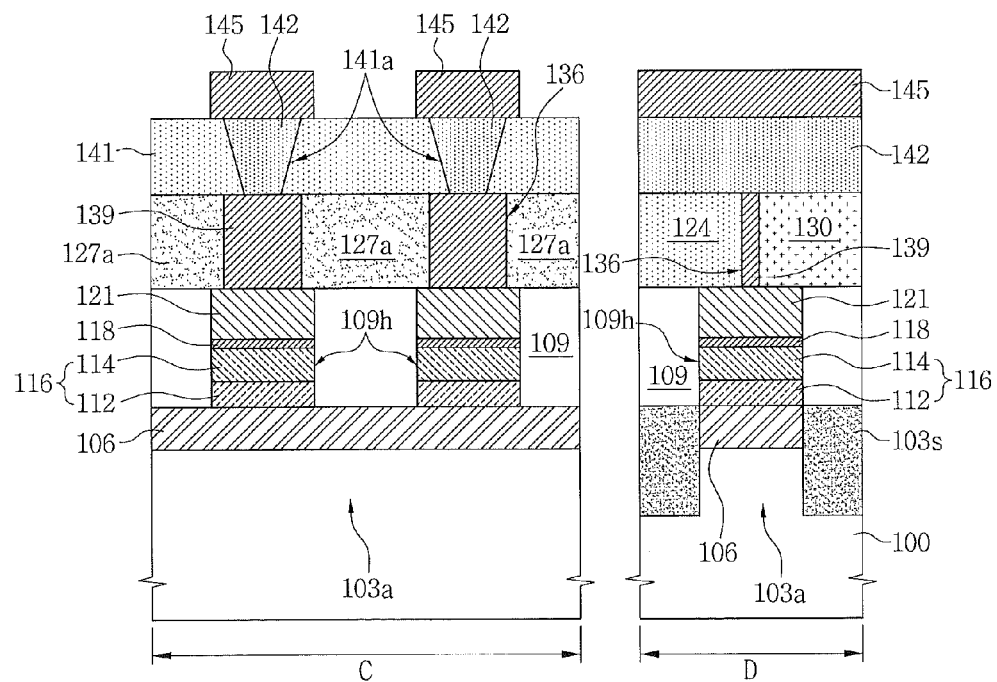

To begin with, methods of fabricating a semiconductor device according to other embodiments will be described with reference to FIGS. 9A through 11B. Specifically, FIGS. 9A, 10A and 11A are plan views illustrating methods of fabricating a semiconductor device according to other embodiments, and FIGS. 9B, 10B and 11B are cross-sectional views corresponding to the plan views of FIGS. 9A, 10A and 11A, respectively. In FIGS. 9B, 10B and 11B, reference character "C" denotes a region taken along line III-III' of FIGS. 9A, 10A and 11A, and reference character "D" denotes a region taken along line IV-IV' of FIGS. 9A, 10A and 11A.

Referring to FIGS. 9A and 9B, an isolation region 103s defining a plurality of active regions 103a may be formed in a predetermined region of a semiconductor substrate 100 of a first conductivity type. Impurity ions of a second conductivity type different from the first conductivity type may be implanted into the active regions 103a, thereby forming first impurity regions 106 of the second conductivity type. The first conductivity type may be a P type, and the second conductivity type may be an N type. Conversely, the first conductivity type may be an N type, and the second conductivity type may be a P type. An interlayer insulating layer 109 may be formed on the entire surface of the semiconductor substrate 100 having the first impurity regions 106. The interlayer insulating layer 109 may be formed of a silicon oxide layer. The interlayer insulating layer 109 may be patterned, thereby forming a plurality of holes 109h exposing predetermined regions of the first impurity regions 106. Semiconductor patterns 116 may be formed in the holes 109h and second and third impurity regions 112 and 114 may be sequentially stacked in the semiconductor patterns 116 in substantially the same manner as described with reference to FIG. 3B. In order to form a cell diode functioning as a switching device, at least one of the second and third impurity regions 112 and 114 may be formed to have a different conductivity type from the first impurity region 106. Cell diode electrodes 118 and conductive plugs 121 may be formed on the semiconductor patterns 116.

First molding patterns 124 may be formed on the semiconductor substrate 1 having the conductive plugs 121 to be spaced apart from one another. Spaces between the first molding patterns 124 may be defined as first openings. When viewed from a plan view, each of the first molding patterns 124 may partially cover the conductive plugs 121. According to the above-described embodiments, it is described that the first molding patterns 24 of FIGS. 4A and 4B may be formed in the shape of lines crossing the first impurity regions 6. However, according to the present embodiments, the first molding patterns 124 of FIGS. 9A and 9B may be formed in the shape of lines parallel to the first impurity regions 106.

Spacer-type insulating layers 127 may be formed on sidewalls of the first molding patterns 124. However, the present invention is not limited thereto, and the insulating layer 127 may be formed to a substantially uniform thickness on the entire surface of the semiconductor substrate 100 having the first molding patterns 124. The insulating layer 127 may include a silicon oxide layer, a silicon nitride layer, a silicon oxynitride (SiON) layer, and/or an insulating carbon layer.

Thereafter, second molding patterns 130 may be formed between the first molding patterns 124. That is, each of the second molding patterns 130 may be disposed between a pair of first molding patterns 124. Also, the insulating layers 127 may be interposed between the first and second molding patterns 124 and 130. The insulating layers 127 may be formed of a material layer having an etch selectivity with respect to the first and second molding patterns 124 and 130.

Referring to FIGS. 10A and 10B, predetermined regions of the insulating layers 127 may be etched, thereby forming insulating patterns 127a having second openings 136 exposing the conductive plugs 121. A mask (not shown) for forming the second openings 136 may be formed using substantially the same method as the method of forming the mask 33 of FIGS. 6A and 6B. In this case, the mask for forming the second openings 136 may include line-shaped patterns crossing the first and second molding patterns 124 and 130. After removing the mask, contact patterns (i.e., first conductive patterns 139) may be formed in the second openings 136 in substantially the same manner as described with reference to FIGS. 7A and 7B.

When viewed from a plan view, each of the first conductive patterns 139 may be formed to have a major axis and a minor axis. The major axis of each of the first conductive patterns 139 may be substantially parallel to the first impurity regions 106.

Referring to FIGS. 11A and 11B, upper molding patterns 141 may be formed to have third openings 141a partially exposing the first conductive patterns 139. That is, the upper molding patterns 141 may be formed to partially cover the first conductive patterns 139, and each of the third openings 141a may partially expose the first conductive pattern 139. The upper molding patterns 141 may be formed of an insulating material layer, such as a silicon oxide layer or a silicon nitride layer.

Each of the upper molding patterns 141 may have a line shape as shown in FIGS. 11A and 11B. However, the present invention is not limited thereto and the upper molding patterns 141 may be formed to have a plurality of holes partially exposing the first conductive patterns 139.

Data storage elements 142 may be formed on the first conductive patterns 139 exposed by the upper molding patterns 141. For example, a data storage material layer may be formed on the semiconductor substrate 100 having the upper molding patterns 141 and planarized until top surfaces of the upper molding patterns 141 are exposed, thereby forming the data storage elements 142. Second conductive patterns 145 may be formed on the data storage elements 142. The data storage elements 142 may be formed of a phase-change material layer as described with reference to FIG. 8B.

Although it is described that the data storage elements 142 are defined in the third openings 141a, the present invention is not limited thereto. For example, the data storage elements 142 may be formed to fill the third openings 141a and partially cover the top surfaces of the upper molding patterns 141.

Hereinafter, methods of fabricating a semiconductor device according to still other embodiments will be described with reference to FIGS. 12A through 15B. Specifically, FIGS. 12A, 13A, 14A and 15A are plan views illustrating methods of fabricating a semiconductor device according to still other embodiments, and FIGS. 12B, 13B, 14B and 15B are cross-sectional views corresponding to the plan views of FIGS. 12A, 13A, 14A and 15A. In FIGS. 12B, 13B, 14B and 15B, reference character "E" denotes a region taken along line V-V' of FIGS. 12A, 13A, 14A and 15A, and reference character "F" denotes a region taken along line VI-VI' of FIGS. 12A, 13A, 14A and 15A.

Figure 12A:
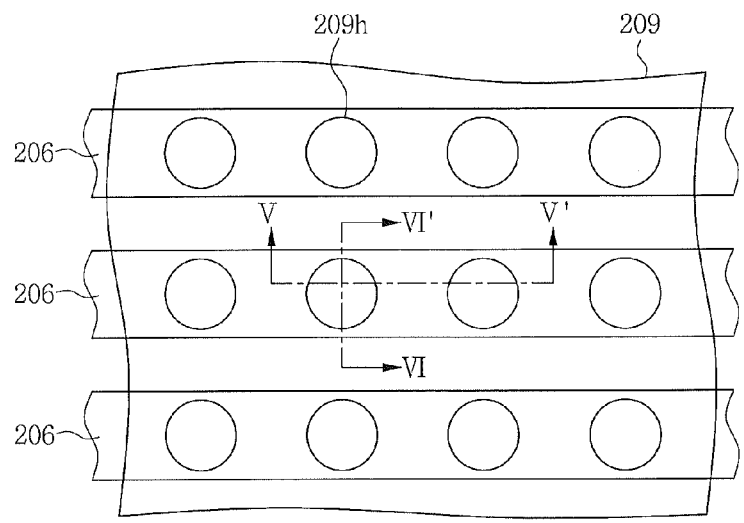
FIGS. 12A through 15B are diagrams of a semiconductor device according to other embodiments.
Figure 12B:
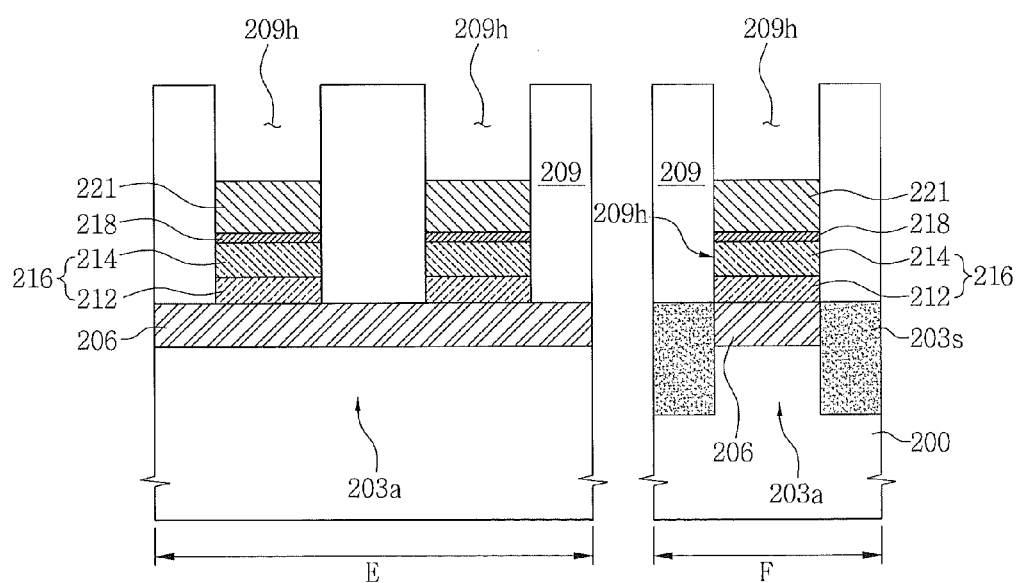

Referring to FIGS. 12A and 12B, an isolation region 203s defining a plurality of active regions 203a may be formed in a predetermined region of a semiconductor substrate 200 of a first conductivity type. Impurity ions of a second conductivity type different from the first conductivity type may be implanted into the active regions 203a, thereby forming first impurity regions 206 of the second conductivity type. The first conductivity type may be a P type, and the second conductivity type may be an N type. Conversely, the first conductivity type may be an N type, and the second conductivity type may be a P type. A first molding pattern 209 having a plurality of first openings 209h exposing the first impurity regions 206 may be formed on the entire surface of the semiconductor substrate 200 having the first impurity regions 206. Although each of the first openings 209h may have a circular shape as shown in FIG. 12A, the present invention is not limited thereto. For example, each of the first openings 209h may have one of other various shapes, such as a rectangular shape or an elliptical shape. That is, the first openings 209h may be holes spaced apart from one another.

Semiconductor patterns 216 may be formed in the first openings 209h and second and third impurity regions 212 and 214 may be sequentially stacked in the semiconductor patterns 216 using substantially the same method as described with reference to FIG. 3B. In order to form a cell diode functioning as a switching device, at least one of the second and third impurity regions 212 and 214 may be formed to have a different conductivity type from the first impurity region 206. Cell diode electrodes 218 and conductive plugs 221 may be formed on the semiconductor patterns 216 and in the first openings 209h. Top surfaces of the conductive plugs 221 may be disposed lower than a top surface of the first molding pattern 209.

Figure 13A:
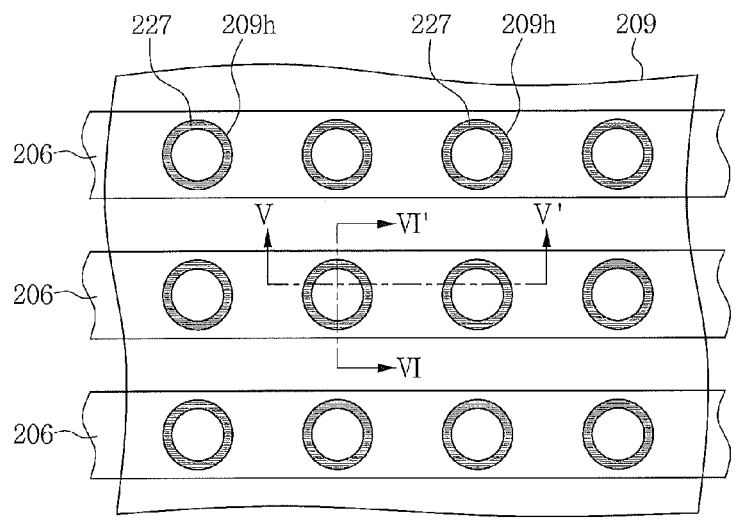
Figure 13B:
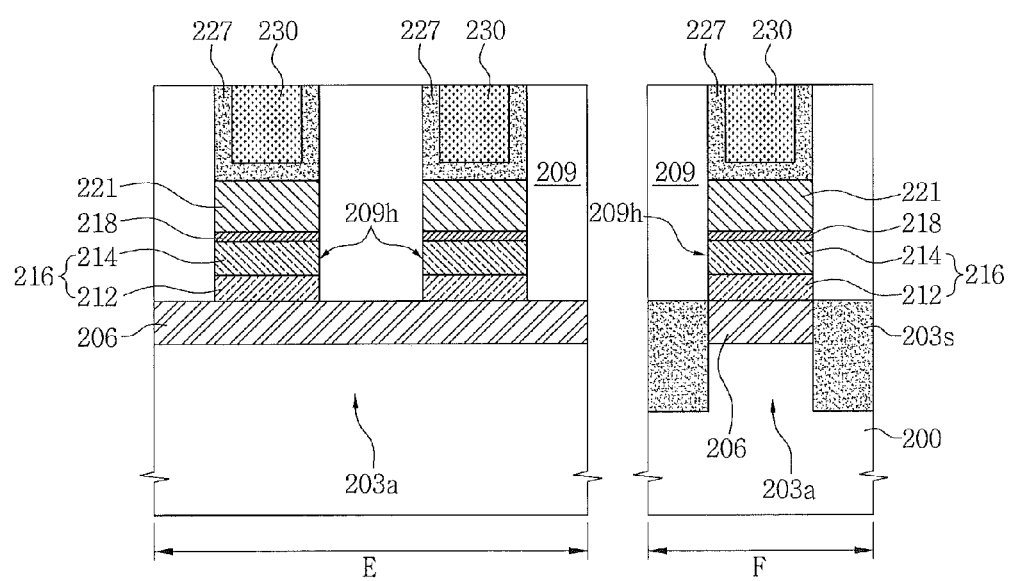

Referring to FIGS. 13A and 13B, an insulating material layer may be formed on the entire surface of the semiconductor substrate 200 having the conductive plugs 221, and a second molding layer may be formed on the insulating material layer to fill the remaining portions of the first openings 209h. Afterwards, the second molding layer and the insulating material layer may be planarized until the top surface of the first molding pattern 209 is exposed. As a result, second molding patterns 230 may be formed on the conductive plugs 221 to fill the remaining portions of the first openings 209h, and insulating layers 227 may be formed to cover sidewalls and bottom surfaces of the second molding patterns 230. That is, the insulating layers 227 may be interposed between the second molding patterns 230 and the first molding pattern 209 and between the second molding patterns 230 and the conductive plugs 221.

Figure 14A:
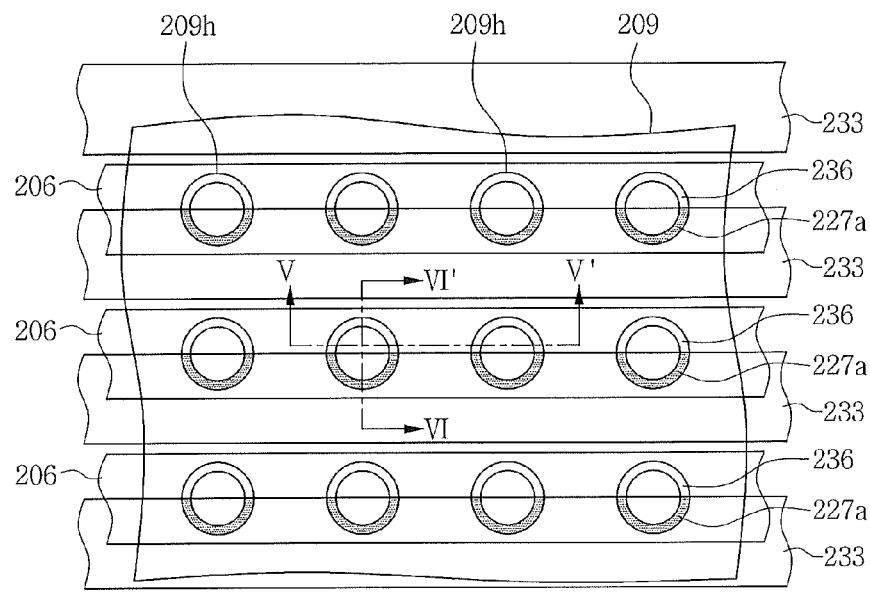
Figure 14B:
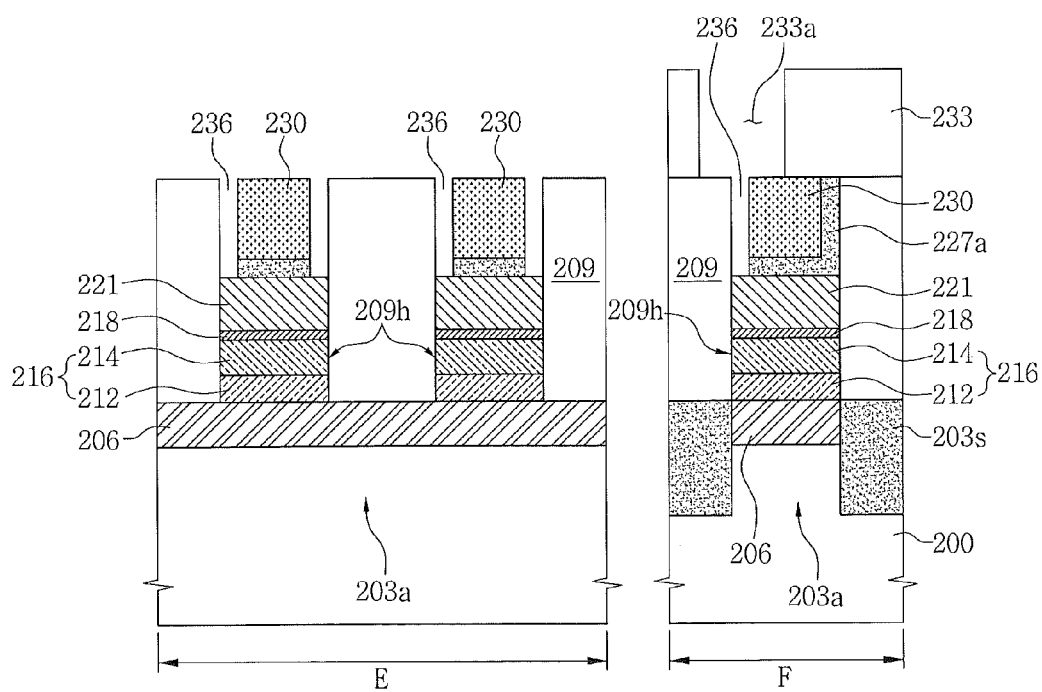

Referring to FIGS. 14A and 14B, a mask 233 may be formed to have mask openings 233a exposing predetermined regions of the insulating layers 227. The mask 233 may have a line shape parallel to the first impurity regions 206.

The insulating layers 227 may be etched using the first and second molding patterns 209 and 230 and the mask 233 as etch masks, thereby forming second openings 236 exposing the conductive plugs 221. The remaining portions of the insulating layers 227 may be defined as insulating patterns 227a.

Figure 15A:
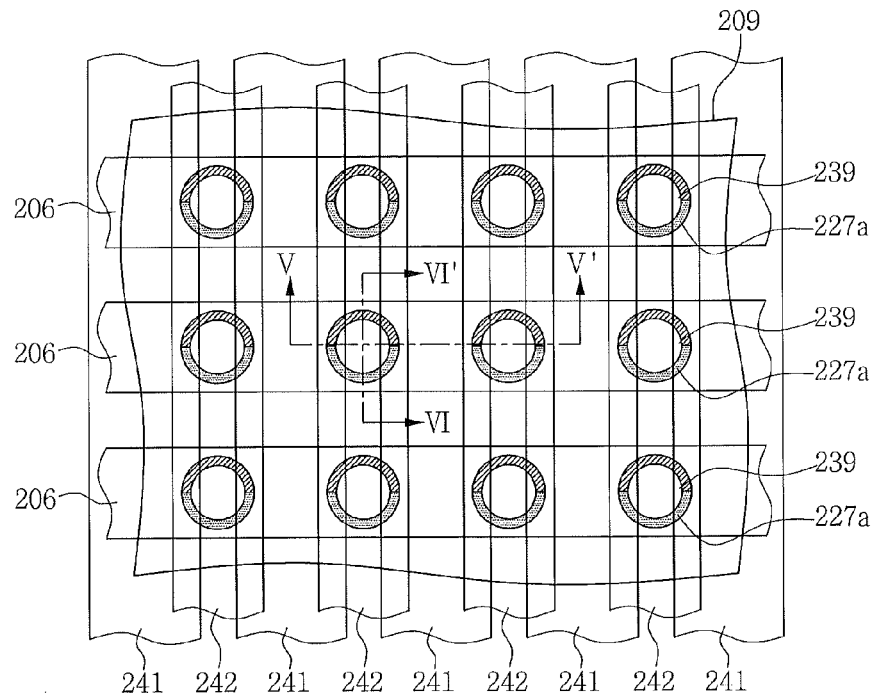
Figure 15B:
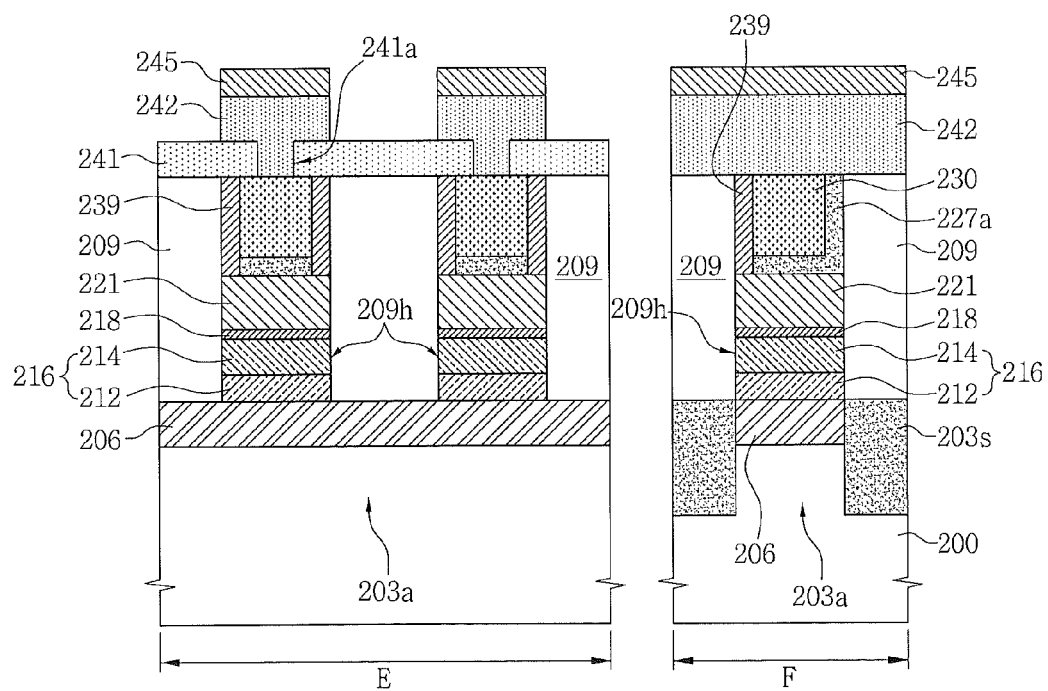

Referring to FIGS. 15A and 15B, the mask 233 may be removed and first conductive patterns 239 may be formed in the second openings 236 in substantially the same manner as described with reference to FIGS. 7A and 7B. Thereafter, upper molding patterns 241 having third openings 241a partially exposing the first conductive patterns 239 may be formed using substantially the same method as described with reference to FIGS. 11A and 11B. Although the third openings 241a may have vertical sidewalls as shown in FIG. 15B, the present invention is not limited thereto and the third openings 241a may have inclined sidewalls like the third openings 141a of FIG. 11B. Data storage elements 242 and second conductive patterns 245 may be formed on portions of the first conductive patterns 239 that are exposed by the third openings 241a. The data storage elements 242 may be formed of a phase-change material layer in the same manner as described with reference to FIG. 8B.

According to various embodiments, after removing the mask 233, data storage elements may be formed in the second openings 236 in the same manner as described with reference to FIG. 8D. In this case, the formation of the upper molding patterns 241 may be omitted, and the data storage elements 242 may be formed to fill the second openings 236 and electrically connected to the conductive plugs 221.

Figure 16A:
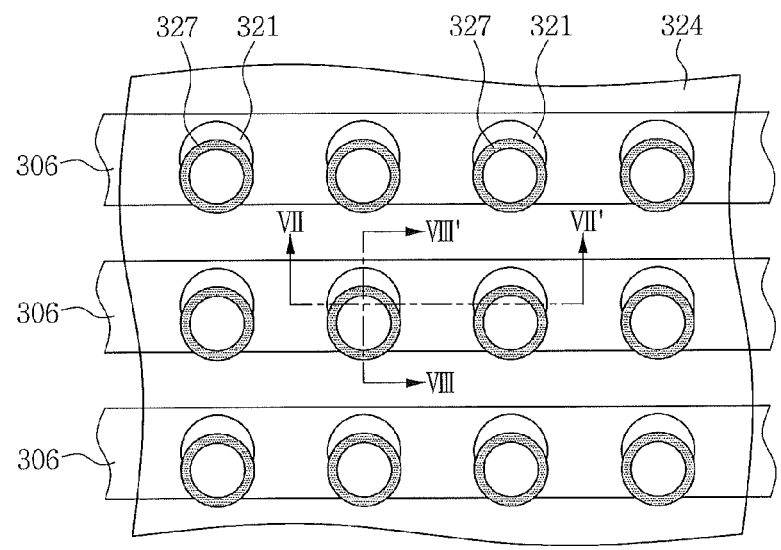
FIGS. 16A through 17B are diagrams of a semiconductor device according to still other embodiments.
Figure 16B:
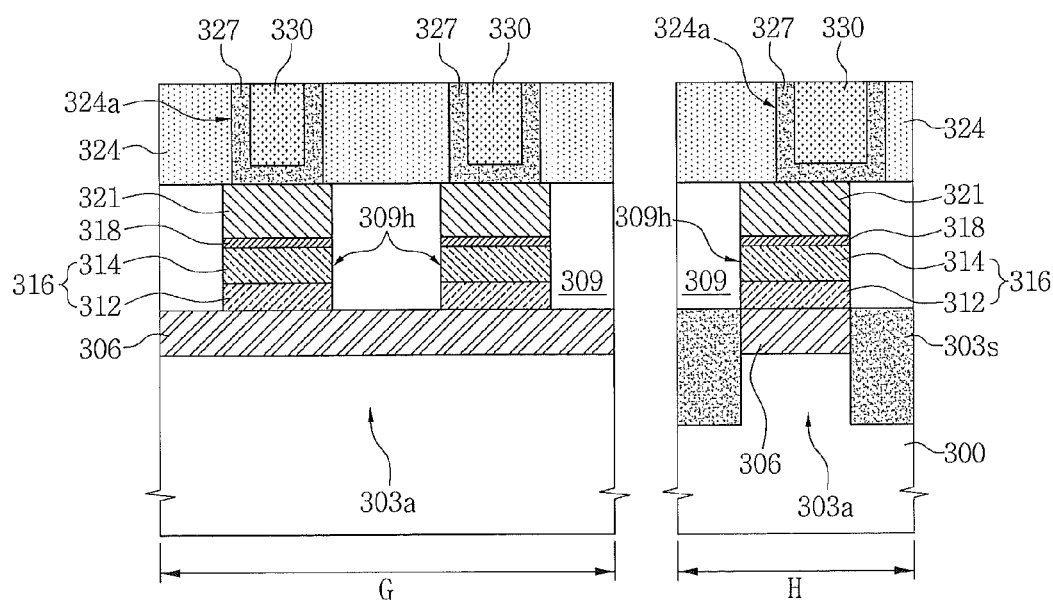
Figure 17A:
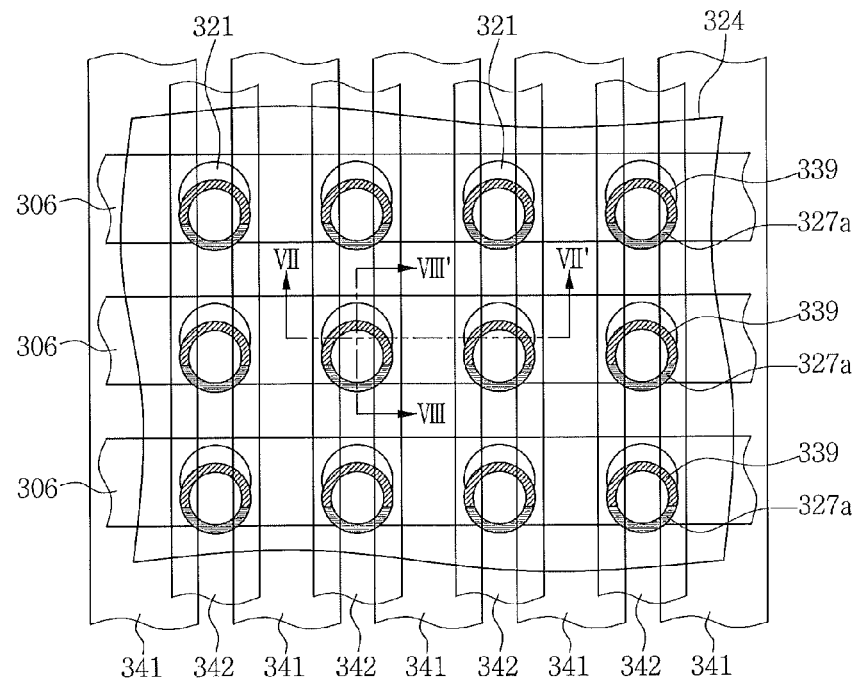
Figure 17B:
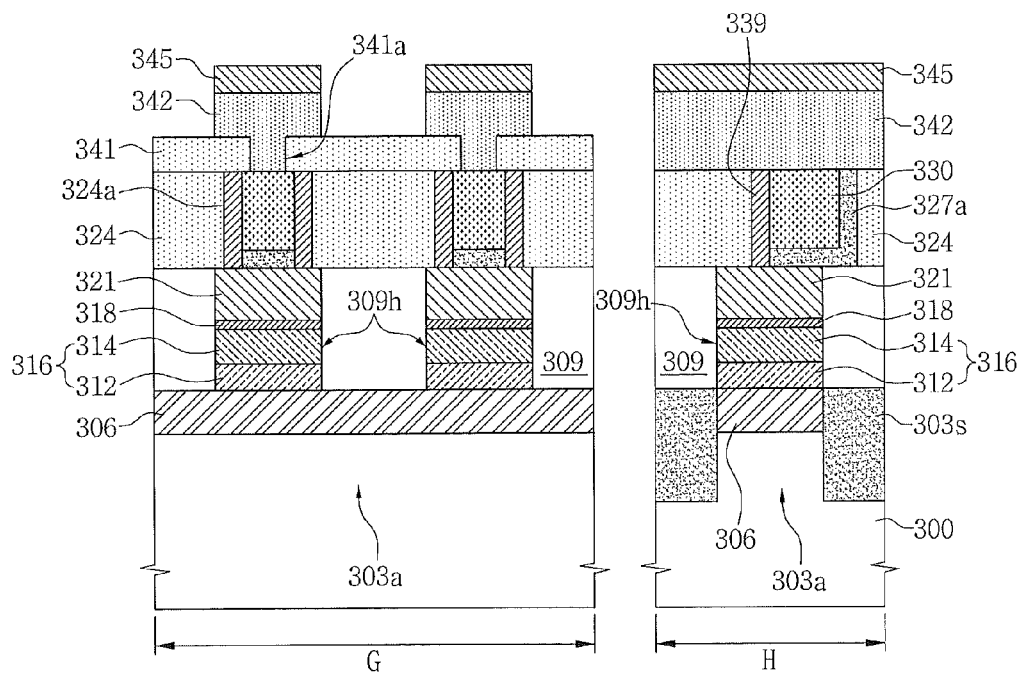

Hereinafter, methods of fabricating a semiconductor device according to yet other embodiments will be described with reference to FIGS. 16A through 17B. Specifically, FIGS. 16A and 17A are plan views illustrating methods of fabricating a semiconductor device according to yet other embodiments, and FIGS. 16B and 17B are cross-sectional views corresponding to the plan views of FIGS. 16A and 17A. In FIGS. 16B and 17B, reference character "G" denotes a region taken along line VII-VII' of FIGS. 16A and 17A, and reference character "H" denotes a region taken along line VIII-VIII' of FIGS. 16A and 17A.

Referring to FIGS. 16A and 16B, an isolation region 303s defining a plurality of active regions 303a may be formed in a predetermined region of a semiconductor substrate 300 of a first conductivity type. Impurity ions of a second conductivity type different from the first conductivity type may be implanted into the active regions 303a, thereby forming first impurity regions 306 of the second conductivity type. The first conductivity type may be a P type, and the second conductivity type may be an N type. Conversely, the first conductivity type may be an N type, and the second conductivity type may be a P type.

An interlayer insulating layer 309 may be formed on the entire surface of the semiconductor substrate 300 having the first impurity regions 306. The interlayer insulating layer 309 may be patterned, thereby forming a plurality of holes 309h exposing predetermined regions of the first impurity regions 306. Semiconductor patterns 316 may be formed in the holes 309h and second and third impurity regions 312 and 314 may be sequentially stacked in the semiconductor patterns 316 using substantially the same method as described with reference to FIG. 3B. In order to form a cell diode functioning as a switching device, at least one of the second and third impurity regions 312 and 314 may be formed to have a conductivity type different from the first impurity region 306. Cell diode electrodes 318 and conductive plugs 321 may be formed on the semiconductor patterns 316 and in the holes 309h.

First molding patterns 324 may be formed to have first openings 324a partially exposing the conductive plugs 321. The first openings 324a may be holes spaced apart from one another. When viewed from a plan view, each of the first openings 324a may have a circular shape, an elliptical shape, or a rectangular shape.

The first openings 324a may partially overlap the conductive plugs 321. For example, edges of the first openings 324a may cross central portions of the conductive plugs 321.

Thereafter, second molding patterns 330 may be formed in the first openings 324a and insulating layers 327 may be formed to cover sidewalls and bottom surfaces of the second molding patterns 330 using substantially the same method as described with reference to FIGS. 13A and 13B. The insulating layers 327 may be formed of a material layer having an etch selectivity with respect to the first and second molding patterns 324 and 330.

Referring to FIGS. 17A and 17B, predetermined regions of the insulating layers 327 may be etched to form second openings using substantially the same method as described with reference to FIGS. 14A and 14B. Also, first conductive patterns 339 may be formed in the second openings using substantially the same method as described with reference to FIGS. 15A and 15B. Accordingly, when viewed from a plan view, central portions of the first conductive patterns 339 may be disposed in the center of the conductive plugs 321, respectively.

Subsequently, in substantially the same manner as described with reference to FIGS. 15A and 15B, upper molding patterns 341 may be formed to have third openings 341a partially exposing the first conductive patterns 339, and data storage elements 342 and second conductive patterns 345 may be sequentially stacked on the first conductive patterns 339 that are exposed by the third openings 341a. The data storage elements 342 may be formed of a phase-change material layer as described with reference to FIG. 8B.

Hereinafter, methods of fabricating the semiconductor device using the transistor TA as the switching device shown in FIG. 2, according to various embodiments will be described with reference to FIG. 18.

Figure 18:
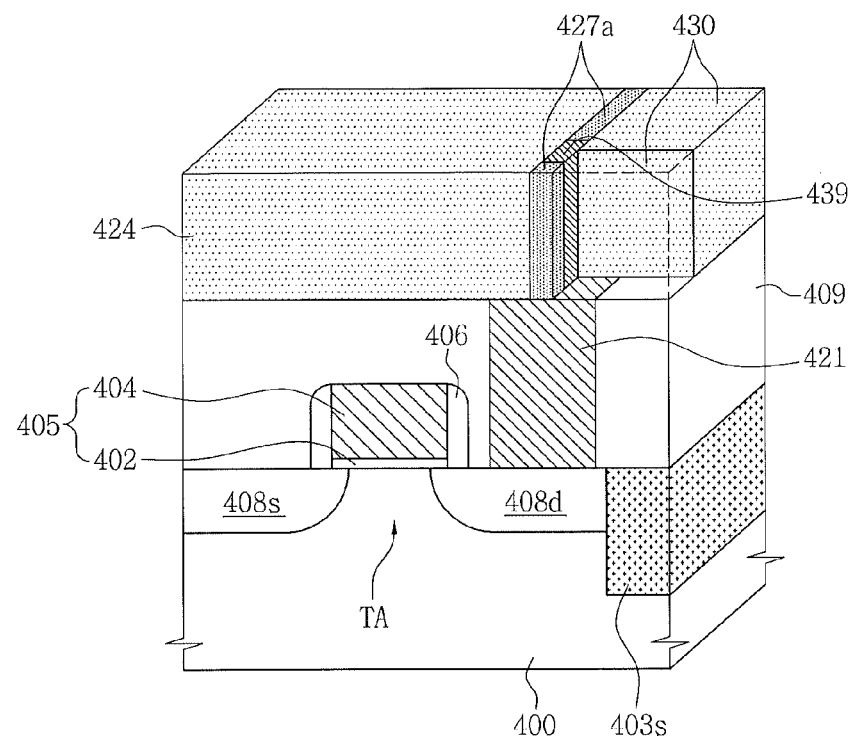
FIG. 18 is a perspective view of a semiconductor device according to yet other embodiments.

Referring to FIG. 18, an isolation region 403s defining an active region may be formed in a semiconductor substrate 400. A gate dielectric layer 402 and a gate electrode 404 may be sequentially stacked on the active region to form a gate pattern 405. Gate spacers 406 may be formed on sidewalls of the gate pattern 405. First and second impurity regions 408s and 408d may be formed in the active region on both sides of the gate pattern 405. Thus, a transistor TA including the gate pattern 405 and the first and second impurity regions 408s and 408d may be formed.

An interlayer insulating layer 409 may be formed on the semiconductor substrate 400 having the transistor TA. Thereafter, a conductive plug 421 may be formed through the interlayer insulating layer 409 and electrically connected to one of the first and second impurity regions 408s and 408d.

The resultant structure having the conductive plug 421 may be treated in substantially the same manner as the resultant structure described with reference to FIGS. 3A and 3B. Thus, the conductive plug 421 may correspond to the conductive plug 21 of FIG. 3B. The resultant structure having the conductive plug 421 may undergo the processes described with reference to FIGS. 4A through 8D, the processes described with reference to FIGS. 9A through 11B, or the processes described with reference to FIGS. 16A through 17B.

In order to apply the methods described with reference to FIGS. 12A through 15B, a process of partially etching the conductive plug 421 of FIG. 18 may be further performed, and the processes described with reference to FIGS. 13A through 15B may be performed on the resultant structure in which the conductive plug 421 is partially etched.

For example, the processes described with reference to FIGS. 9A through 10B may be performed on the semiconductor substrate 400 having the conductive plug 421. Thus, a first molding pattern 424 and a second molding pattern 430 may be formed on the semiconductor substrate 400 having the conductive plug 421 to be spaced apart from each other. Insulating patterns 427a may be formed between the first and second molding patterns 424 and 430. Thereafter, a contact pattern 439 may be formed to be surrounded by sidewalls of the first and second molding patterns 424 and 430 and sidewalls of the insulating patterns 427a. The second molding pattern 430 is illustrated with dotted lines in FIG. 18 to clarify the relationship between the contact pattern 439 and the conductive plug 421. Here, the contact pattern 439 may correspond to the first conductive patterns 39, 139, and 239 of FIGS. 7B, 10B, and 15B, the sequentially stacked first conductive pattern 1039 and data storage element 1042 of FIG. 8C, or the data storage element 2042 of FIG. 8D.

Hereinafter, structures of semiconductor devices according to some embodiments will be described.

To begin with, a semiconductor device according to some embodiments will be described with reference to FIGS. 8A and 8B.

Referring to FIGS. 8A and 8B, an isolation region 3s defining a plurality of active regions 3a may be provided in a predetermined region of a semiconductor substrate 1 of a first conductivity type. The isolation region 3s may be a trench isolation layer. The active regions 3a may be defined substantially parallel to one another.

According to various embodiments, the semiconductor substrate 1 may be a silicon-on-insulator (SOI) substrate having single crystalline semiconductor body patterns. In this case, the single crystalline semiconductor body patterns may correspond to the active regions 3a, and an insulating isolation layer corresponding to the isolation region 3s may be filled between the single crystalline semiconductor body patterns.

First impurity regions 6 of a second conductivity type different from the first conductivity type may be provided in the active regions 3a. The first conductivity type may be a P type, and the second conductivity type may be an N type. Conversely, the first conductivity type may be an N type, and the second conductivity type may be a P type. Each of the first impurity regions 6 may correspond to the word line WL1 of FIG. 1.

An interlayer insulating layer 9 having holes 9h exposing the first impurity regions 6 may be formed on the entire surface of the semiconductor substrate 1 having the first impurity regions 6. The holes 9h may have a circular shape when viewed from a plan view. However, the holes 9h are not limited to the circular shape. For example, when viewed from a plan view, the holes 9h may have a rectangular shape or an elliptical shape.

Semiconductor patterns 16 may be formed in the holes 9h. Each of the semiconductor patterns 16 may include an impurity region of a second conductivity type different from the first conductivity type. For example, each of the semiconductor patterns 16 may include a second impurity region 12 and a third impurity region 14 that are sequentially stacked. The second impurity region 12 may have a lower dopant concentration than the first impurity region 6 or the third impurity region 14. At least one of the second and third impurity regions 12 and 14 may have a different conductivity type from the first impurity region 6. Thus, impurity regions of different conductivity types may be provided to constitute a diode D as shown in FIG. 1.

Cell diode electrodes 18 may be provided on the semiconductor patterns 16. Conductive plugs 21 formed of a metallic material, such as tungsten, may be provided on the cell diode electrodes 18. The conductive plugs 21 may be provided in the holes 9h.

Meanwhile, each of the conductive plugs 21 may include regions having different resistivities. For example, each of the conductive plugs 21 may include a first region having a first resistivity and a second region having a second resistivity higher than the first resistivity. The second region may be disposed on the first region. In other words, upper regions of the conductive plugs 21 may be high-resistance regions, while lower regions of the conductive plugs 21 may be low-resistance regions. For example, each of the conductive plugs 21 may include at least two layers including a Ti layer, a Si layer, a Ta layer, a Mo layer, a W layer, a Ru layer, a Ta layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, and/or a Cu group layer. Here, an upper layer of the at least two layers may have a higher resistivity than a lower layer thereof.

First molding patterns 24 and second molding patterns 30 may be provided on the semiconductor substrate 1 having the conductive plugs 21 spaced apart from one another. Insulating patterns 27a may be provided between the first and second molding patterns 24 and 30. The insulating patterns 27a may be formed of a material layer having an etch selectivity with respect to the first and second molding patterns 24 and 30. The insulating patterns 27a may include a silicon oxide layer, a silicon nitride layer, a silicon oxynitride (SiON) layer, and/or an insulating carbon layer.

Spaces 36 may be defined by sidewalls of the first and second molding patterns 24 and 30 and sidewalls of the insulating patterns 27a. Contact patterns, for example, first conductive patterns 39, may be provided in the spaces 36. The spaces 36 may be defined as holes. The first conductive patterns 39 may include a Ti layer, a Si layer, a Ta layer, a Mo layer, a W layer, a Ru layer, a Ta layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and combinations thereof. The first conductive patterns 39 may be electrically connected to the conductive plugs 21.

Data storage elements 42 and second conductive patterns 45 may be sequentially stacked on the first conductive patterns 39. The data storage elements 42 may correspond to the data storage element Rp1 of FIG. 1, and the second conductive patterns 45 may be electrically connected to the bit line BL1 of FIG. 1 or function as the bit line BL1.

The data storage elements 42 may be formed in the shape of lines spaced apart from one another. For instance, when viewed from a plan view, the data storage elements 42 may be formed in the shape of lines crossing the first impurity regions 6. Alternatively, the data storage elements 42 may be formed in the shape of islands spaced apart from one another.

The data storage elements 42 may include Te, Se, Ge, Sb, Bi, Pb, Sn, Ag, As, S, Si, P, O, and/or C. For example, the data storage elements 42 may be formed of a chalcogenide layer, such as a GeSbTe (GST) layer, and applied to a phase-change memory cell.

According to various embodiments, the first conductive patterns 39 and the data storage elements 42 of FIG. 8B may be embodied in forms shown in FIG. 8C. Referring to FIG. 8C, first conductive patterns 1039 may be provided to partially fill the spaces 36. Also, data storage elements 1042 may be provided to fill the remaining portions of the spaces 36. Thus, according to some embodiments of FIG. 8C, the spaces 36 may be filled with both the first conductive patterns 1039 and the data storage elements 1042. That is, interfacial areas between the first conductive patterns 1039 and the data storage elements 1042 that are sequentially stacked may be minimized in the spaces 36.

According to various embodiments, the first conductive patterns 39 and the data storage elements 42 of FIG. 8B may be embodied in forms shown in FIG. 8D. Referring to FIG. 8D, spaces 36 may be filled with data storage elements 2042 instead of the first conductive patterns 39 of FIG. 8B.

Hereinafter, a semiconductor device according to various embodiments will be described with reference to FIGS. 11A and 11B.

Referring to FIGS. 11A and 11B, first and second molding patterns 124 and 130 may be provided on a semiconductor substrate 100 to be spaced apart from each other. Insulating patterns 127a may be provided between the first and second molding patterns 124 and 130. The insulating patterns 127a may be formed of a material layer having an etch selectivity with respect to the first and second molding patterns 124 and 130. Spaces 136 may be defined by sidewalls of the first and second molding patterns 124 and 130 and sidewalls of the insulating patterns 127a. First conductive patterns 139 may be provided in the spaces 136. The spaces 136 may be defined as holes.

Upper molding patterns 141 may be provided to have openings 141a partially exposing the first conductive patterns 139. Data storage elements 142 may be provided on the first conductive patterns 139 that are exposed by the openings 141a. Second conductive patterns 145 may be provided on the data storage elements 142. Sidewalls of the data storage elements 142 may be surrounded by the upper molding patterns 141.

According to various embodiments, the data storage elements 142 may fill the openings 141a and partially cover top surfaces of the upper molding patterns 141.

The sizes of top surfaces of the first conductive patterns 139 may be limited by the holes 136 and the upper molding patterns 141 so that interfacial areas between the first conductive patterns 139 and the data storage elements 142 can be minimized.

Hereinafter, a semiconductor device according to various embodiments will be described with reference to FIGS. 15A and 15B.

Referring to FIGS. 15A and 15B, an isolation region 203s defining a plurality of active regions 203a may be provided in a predetermined region of a semiconductor substrate 200 of a first conductivity type. First impurity regions 206 of a second conductivity type different from the first conductivity type may be provided in the active regions 203a. The first conductivity type may be a P type, and the second conductivity type may be an N type. Conversely, the first conductivity type may be an N type, and the second conductivity type may be a P type.

A first molding pattern 209 having holes 209h exposing the first impurity regions 206 may be provided on the semiconductor substrate 200 having the first impurity regions 206. Semiconductor patterns 216 may be provided in the holes 209h. Each of the semiconductor patterns 216 may include an impurity region of a second conductivity type different from the first conductivity type. For example, each of the semiconductor patterns 216 may include a second impurity region 212 and a third impurity region 214 that are sequentially stacked. At least one of the second and third impurity regions 212 and 214 may have a conductivity type different from the first impurity region 206. Thus, impurity regions of different conductivity types may constitute the diode D described with reference to FIG. 1.

Diode electrodes 218 and conductive plugs 221 may be sequentially stacked in the holes 209h and on the semiconductor patterns 216. Top surfaces of the conductive plugs 221 may be disposed lower than a top surface of the first molding pattern 209.

Second molding patterns 230 may be provided in the holes 209h and spaced apart from the first molding pattern 209. Insulating patterns 227a may be provided between the first and second molding patterns 209 and 230. The insulating patterns 227a may be formed of a material layer having an etch selectivity with respect to the first and second molding patterns 209 and 230.

First conductive patterns 239 may be defined by sidewalls of the first and second molding patterns 209 and 230 and sidewalls of the insulating patterns 227a. Sidewalls of the first conductive patterns 239 may be self-aligned with sidewalls of the conductive plugs 221.

Upper molding patterns 241 may be provided to have openings 241a partially exposing top surfaces of the first conductive patterns 239. For example, central portions of the top surfaces of the first conductive patterns 239 may be exposed by the upper molding patterns 241. Thereafter, data storage elements 242 may be provided to form interfacial areas between the data storage elements 242 and the top surfaces of the first conductive patterns 239 exposed by the openings 241a. Second conductive patterns 245 may be provided on the data storage elements 242. The second conductive patterns 245 may be electrically connected to bit lines of a memory device or function as bit lines.

Sidewalls of the first conductive patterns 239 may be aligned with the sidewalls of the conductive plugs 221. However, the present invention is not limited thereto. For example, the first conductive patterns 239 of FIGS. 15A and 15B may be formed in the same manner as the first conductive patterns 339 of FIGS. 17A and 17B. In other words, central portions of the first conductive patterns 339 of FIGS. 17A and 17B may be disposed in the center of the conductive plugs 321, respectively, when viewed from a plan view.

Hereinafter, a semiconductor device according to various embodiments will be described with reference to FIG. 18. Referring to FIG. 18, an isolation region 403s defining an active region may be disposed in a semiconductor substrate 400. A gate pattern 405 may be provided on the active region. The gate pattern 405 may include a gate dielectric layer 402 and a gate electrode 404 that are sequentially stacked. First and second impurity regions 408s and 408d may be provided in the active region on both sides of the gate pattern 405. Accordingly, a transistor TA including the gate pattern 405 and the first and second impurity regions 408s and 408d may be provided. The transistor TA may be used as a switching device as described above with reference to FIG. 2.

An interlayer insulating layer 409 may be provided on the semiconductor substrate 400 having the transistor TA. Afterwards, a conductive plug 421 may be disposed through the interlayer insulating layer 409 and electrically connected to one of the first and second impurity regions 408s and 408d.

A first molding pattern 424 and a second molding pattern 430 may be provided on the semiconductor substrate 400 having the conductive plug 421 and spaced apart from each other. Insulating patterns 427a may be provided between the first and second molding patterns 424 and 430. A contact pattern 439 may be defined by sidewalls of the first and second molding patterns 424 and 430 and sidewalls of the insulating patterns 427a. When viewed from a plan view, the contact pattern 439 may have a major axis and a minor axis. Alternatively, the contact pattern 439 may have an arc shape as shown in FIG. 15A and/or FIG. 17A.

The contact pattern 439 may correspond to the first conductive patterns 39, 139, and 239 of FIGS. 8B, 11B, and 15B, the sequentially stacked first conductive pattern 1039 and data storage element 1042 described with reference to FIG. 8C, or the data storage element 2042 described with reference to FIG. 8D.

Substantially the same elements as described in the above-described embodiments, for example, an upper molding pattern, a data storage element, and a second conductive pattern, may be selectively provided on the contact pattern 439.

Figure 19:
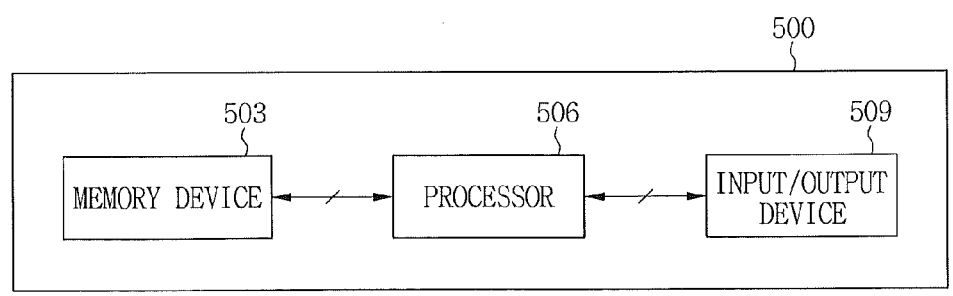
FIG. 19 is a schematic block diagram of an electronic system according to some embodiments.

FIG. 19 is a schematic block diagram of an electronic system using memory cells according to some embodiments.

Referring to FIG. 19, an electronic system 500 may include at least one memory device 503 functioning as a data storage medium and a processor 506 connected to the memory device 503. In this case, the memory devices 503 may include memory cells described with reference to FIGS. 1 through 18. The electronic system 500 may be used for products that require data storage media, such as portable memory devices, computers, digital cameras, digital TVs, electronic dictionaries, and communication apparatuses. The processor 506 and the memory device 503 may be installed on a board so that the memory device 503 can serve as a program memory to store a code and data for executing the processor 506.

The electronic system 500 may interchange data with another electronic system, such as a personal computer (PC) or a computer network, through an input/output device 509. The input/output device 509 may transmit data to a peripheral bus line, a high-speed digital transmission line, or a wireless transmitter/receiver antenna of a computer. Not only data communication between the processor 506 and the memory device 503 but also data communication between the processor 506 and the input/output device 509 may be performed using conventional computer bus architectures.

According to some embodiments, methods of forming contact structures that can minimize an interfacial area between structures contacting each other is provided. A contact pattern formed using the methods may be used as one of an electrode, a phase-change material layer, and a combination thereof. Accordingly, since the interfacial area between the phase-change material layer and the electrode can be minimized, the reset current of a PRAM can be minimized.

The foregoing is illustrative of some embodiments and is not to be construed as limiting thereof. Although a few embodiments have been described, those skilled in the art will readily appreciate that many modifications are possible in the embodiments without materially departing from the novel teachings and advantages. Accordingly, all such modifications are intended to be included within the scope of this invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming a contact structure, comprising:
   forming a first molding pattern on a substrate;
   forming an insulating layer to cover at least a sidewall of the first molding pattern;
   forming a second molding pattern to cover a sidewall of the insulating layer and spaced apart from the first molding pattern;
   removing a portion of the insulating layer between the first and second molding patterns to form a hole and an insulating pattern; and
   forming a contact pattern in the hole, wherein the hole is defined by sidewalls of the first and second molding patterns and a sidewall of the insulating pattern.

2. The method of claim 1, wherein the contact pattern includes a phase change material layer.

3. A method of fabricating a semiconductor device, comprising:
   forming a first molding pattern having a first opening on a semiconductor substrate;
   forming an insulating layer to cover at least a sidewall of the first opening;
   forming a second molding pattern to fill a remaining portion of the first opening having the sidewall covered by the insulating layer;
   removing a portion of the insulating layer to form a second opening defined by sidewalls of the first and second molding patterns; and
   forming a contact pattern in the second opening.

4. The method of claim 3, further comprising: before forming the first molding pattern,
   forming a switching device on the semiconductor substrate; and
   forming a conductive plug that is electrically connected to the switching device and has a sidewall surrounded by an insulating material,
   wherein the conductive plug is electrically connected to the contact pattern.

5. The method of claim 4, wherein forming the switching device and the conductive plug comprises:
   forming a first impurity region in the semiconductor substrate;
   forming an interlayer insulating layer on the semiconductor substrate having the first impurity region;
   patterning the interlayer insulating layer, and forming a hole exposing the first impurity region;
   forming a semiconductor pattern in the hole, the semiconductor pattern having a second impurity region having a different conductivity type from the first impurity region; and
   forming a conductive plug on the semiconductor pattern and in the hole.

6. The method of claim 5, wherein the conductive plug is formed to partially fill the hole, the remaining portion of the hole in which the conductive plug is formed is defined as the first opening, and the interlayer insulating layer having the first opening is defined as the first molding pattern.

7. The method of claim 4, wherein the first opening partially exposes the conductive plug.

8. The method of claim 3, wherein the first opening has a line or hole shape when viewed from a plan view.

9. The method of claim 3, wherein the contact pattern includes a conductive material layer.

10. The method of claim 9, further comprising forming a data storage element on the contact pattern.

11. The method of claim 10, further comprising, before forming the data storage element, partially etching the contact pattern to partially fill the second opening.

12. The method of claim 11, wherein the data storage element fills the second opening together with the partially etched contact pattern.

13. The method of claim 10, further comprising, before forming the data storage element, forming an upper molding pattern having a third opening partially exposing the contact pattern.

14. The method of claim 13, wherein at least a portion of a sidewall of the data storage element is surrounded by the upper molding pattern.

15. The method of claim 3, wherein the contact pattern includes at least one of a conductive material layer and a data storage material layer.

16. The method of claim 3, wherein patterning the insulating layer comprises:
forming a mask to partially expose the insulating layer; and
selectively etching the partially exposed insulating layer.

17. The method of claim 3, wherein the insulating layer is between the second molding pattern and the substrate.

18. The method of claim 3, wherein forming the contact pattern includes forming a conductive layer on the substrate and planarizing the conductive layer until the first molding pattern and the second molding pattern are exposed.

19. The method of claim 3, wherein the second opening is further defined by a sidewall of the insulating layer.

20. A method of fabricating a semiconductor device, comprising:
forming first and second lower electrodes spaced apart on a semiconductor substrate;
forming a first molding pattern having a first opening on the semiconductor substrate, the first opening having a first sidewall between sidewalls of the first lower electrode and a second sidewall between sidewalls of the second lower electrode;
forming an insulating layer to cover the first and second sidewalls of the first opening;
forming a second molding pattern to fill a remaining portion of the first opening between the first and second sidewalls covered by the insulating layer;
removing a portion of the insulating layer to form a second opening defined by a sidewall of the first molding pattern and a sidewall of the second molding pattern;
forming a contact pattern in the second opening; and
forming an upper electrode on the contact pattern.

* * * * *